(12) United States Patent
Wang et al.

(10) Patent No.: US 10,916,599 B2
(45) Date of Patent: Feb. 9, 2021

(54) ARRAY SUBSTRATE, DISPLAY APPARATUS AND LUMINANCE CALIBRATION METHOD THEREFOR

(71) Applicant: BOE TECHNOLOGY GROUP CO., LTD., Beijing (CN)

(72) Inventors: Pengpeng Wang, Beijing (CN); Haisheng Wang, Beijing (CN); Xiaoliang Ding, Beijing (CN); Wei Liu, Beijing (CN); Changfeng Li, Beijing (CN); Yanling Han, Beijing (CN); Ping Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/631,280

(22) PCT Filed: Apr. 16, 2019

(86) PCT No.: PCT/CN2019/082944
§ 371 (c)(1),
(2) Date: Jan. 15, 2020

(87) PCT Pub. No.: WO2019/218831
PCT Pub. Date: Nov. 21, 2019

(65) Prior Publication Data
US 2020/0212137 A1    Jul. 2, 2020

(30) Foreign Application Priority Data

May 14, 2018    (CN) .......................... 2018 1 0458386

(51) Int. Cl.
*H01L 27/32*    (2006.01)
*G09G 3/3266*    (2016.01)
(Continued)

(52) U.S. Cl.
CPC ......... *H01L 27/3227* (2013.01); *G09G 3/325* (2013.01); *G09G 3/3266* (2013.01);
(Continued)

(58) Field of Classification Search
CPC ....... G09G 2320/043; G09G 2320/029; G09G 2320/0233; G09G 2320/045;
(Continued)

(56) References Cited

U.S. PATENT DOCUMENTS 6,995,753 B2 * 2/2006 Yamazaki ................ G09G 3/30
345/100
9,379,151 B1 * 6/2016 Wei .................... H01L 27/14643
(Continued)

FOREIGN PATENT DOCUMENTS

CN    1734541 A    2/2006
CN    103280181 A    9/2013
(Continued)

OTHER PUBLICATIONS

International Search Report and Written Opinion issued in corresponding International Application No. PCT/CN2019/082994, dated Jul. 1, 2019, with English translation.
(Continued)

*Primary Examiner* — Dong Hui Liang
(74) *Attorney, Agent, or Firm* — McDermott Will & Emery LLP

(57) ABSTRACT

An array substrate includes a plurality of sub-pixels and at least one light photosensitive detection assembly, and each photosensitive detection assembly corresponds to at least one sub-pixel. The at least one photosensitive detection assembly includes: a photosensitive element and a signal reading element coupled to the photosensitive element and a first reading signal line, the photosensitive element is configured to detect a luminance of a corresponding sub-
(Continued)

pixel, and output a light detection signal according to the luminance of the corresponding sub-pixel. The signal reading element is configured to read the light detection signal output by the photosensitive element, and output a first detection signal to the first reading signal line according to the light detection signal.

20 Claims, 17 Drawing Sheets

(51) Int. Cl.
G09G 3/3291 (2016.01)
G09G 3/325 (2016.01)

(52) U.S. Cl.
CPC ....... *G09G 3/3291* (2013.01); *H01L 27/3276* (2013.01); *G09G 2300/0842* (2013.01); *G09G 2320/0233* (2013.01)

(58) Field of Classification Search
CPC ..... G09G 2320/0295; G09G 2320/041; G09G 2300/0819; G09G 2300/0452; G09G 3/22; H01L 27/3227
See application file for complete search history.

(56) References Cited

U.S. PATENT DOCUMENTS

| | | | |
|---|---|---|---|
| 2003/0150979 A1* | 8/2003 | Lauffenburger | G01J 1/44 250/214 R |
| 2006/0012311 A1 | 1/2006 | Ogawa | |
| 2007/0242030 A1* | 10/2007 | Kim | G09G 3/3406 345/102 |
| 2008/0024476 A1 | 1/2008 | Choi et al. | |
| 2011/0164010 A1* | 7/2011 | Yamamoto | G09G 3/3233 345/207 |
| 2013/0188085 A1* | 7/2013 | Shim | H04N 5/359 348/333.08 |
| 2016/0027382 A1* | 1/2016 | Chaji | G09G 3/3233 345/212 |
| 2016/0104422 A1* | 4/2016 | Kishi | G09G 3/006 345/205 |
| 2016/0247450 A1* | 8/2016 | Liu | G09G 3/3258 |
| 2017/0256205 A1 | 9/2017 | Zhu et al. | |
| 2019/0075261 A1 | 3/2019 | Machida et al. | |
| 2019/0164493 A1 | 5/2019 | Liu et al. | |

FOREIGN PATENT DOCUMENTS

| | | |
|---|---|---|
| CN | 106782330 A | 5/2017 |
| CN | 107464529 A | 12/2017 |
| CN | 107731880 A | 2/2018 |
| CN | 107801425 A | 3/2018 |
| CN | 107863065 A | 3/2018 |
| CN | 108649059 A | 10/2018 |

OTHER PUBLICATIONS

First Office Action issued in corresponding Chinese Application No. 201810458386.9, dated Mar. 18, 2020, with English tanguage translation.

* cited by examiner

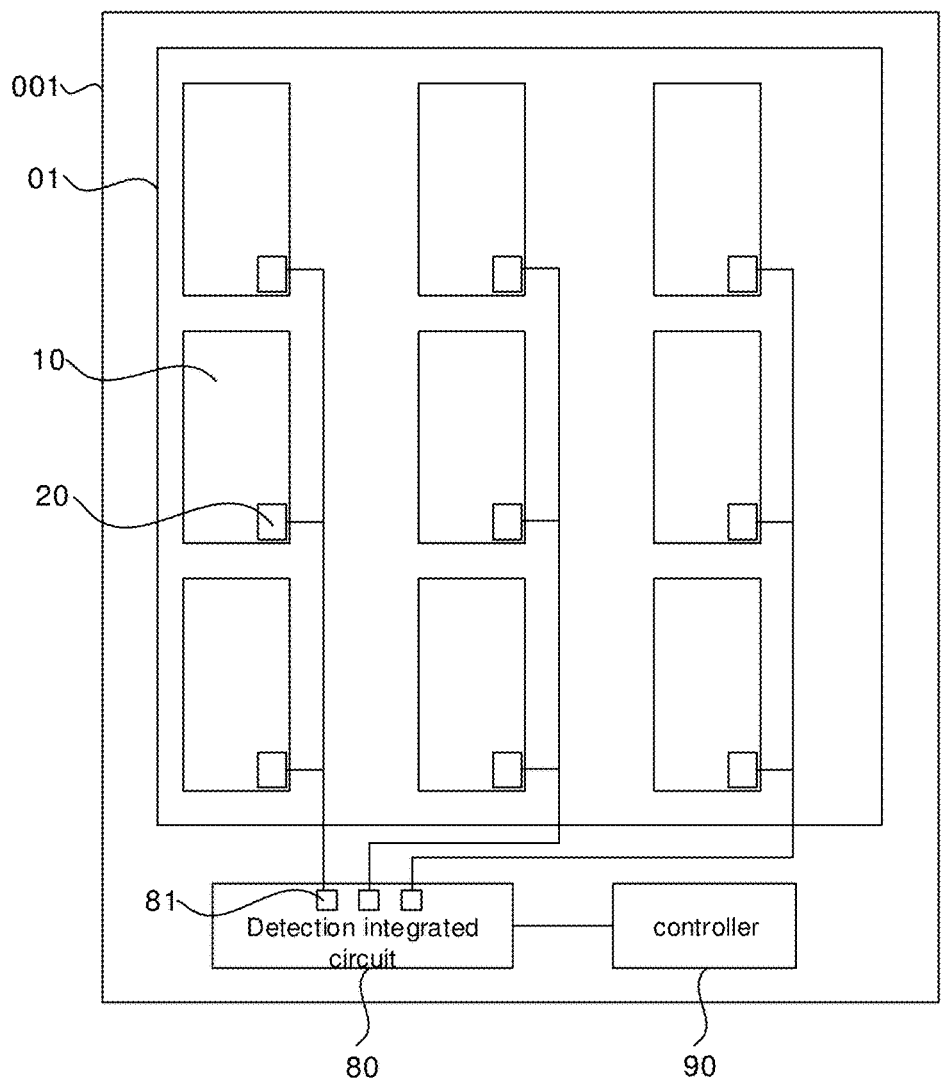

FIG. 17

| In the photosensitive detection period, a photosensitive element of a photosensitive detection assembly in the array substrate detects a luminance of a corresponding sub-pixel, and outputs a light detection signal to a signal reading element according to the luminance of the corresponding sub-pixel; the signal reading element reads the light detection signal and outputs a first detection signal to a first reading signal line according to the light detection signal; and the first reading signal line transmits the first detection signal to the detection integrated circuit | — S11 |

↓

| In the photosensitive calibration period, the luminance of the corresponding sub-pixel is calibrated according to the first detection signal transmitted by the detection integrated circuit | — S12 |

FIG. 18

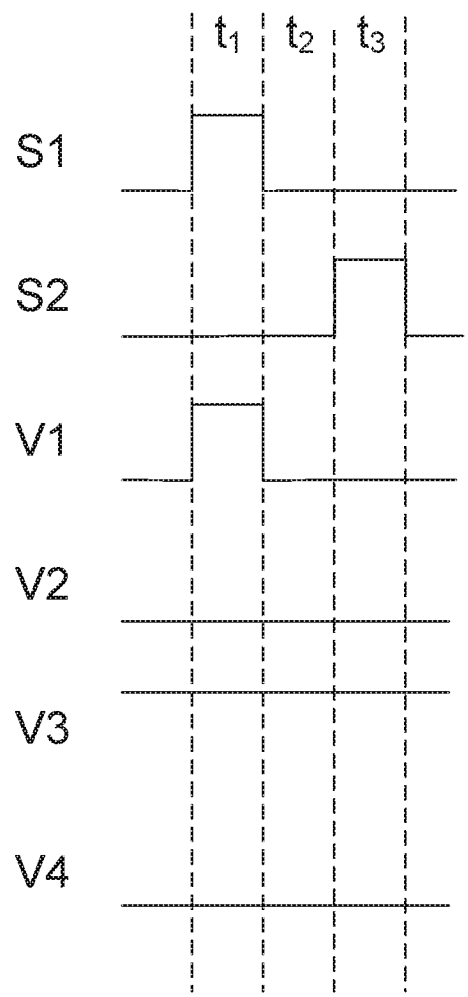

FIG. 19

In the electronic detection period, the electronic detection circuit in the array substrate detects the light-emitting driving current of the corresponding sub-pixel under the control of the third control terminal, and outputs a second detection signal to the second reading signal line according to the light-emitting driving current; and the second reading signal line transmits the second detection signal to the detection integrated circuit — S12

In the electronic calibration period, the luminance of the corresponding sub-pixel is calibrated according to the second detection signal transmitted by the detection integrated circuit — S22

FIG. 20

ARRAY SUBSTRATE, DISPLAY APPARATUS AND LUMINANCE CALIBRATION METHOD THEREFOR

CROSS-REFERENCE TO RELATED APPLICATIONS

This application is a national phase entry under 35 USC 371 of International Patent Application No. PCT/CN2019/082944 filed on Apr. 16, 2019, which claims priority to Chinese Patent Application No. 201810458386.9, filed with the Chinese Patent Office on May 14, 2018, titled "ARRAY SUBSTRATE, DISPLAY APPARATUS AND DRIVING METHOD THEREFOR", which are incorporated herein by reference in their entirety.

TECHNICAL FIELD

The present disclosure relates to the field of display technologies, and in particular, to an array substrate, a display apparatus and a luminance calibration method therefor.

BACKGROUND

Organic light-emitting diode (OLEO) displays have been widely used in various display apparatuses including electronic products such as computers and mobile phones due to their advantages of low power consumption, self-luminescence, wide viewing angle, fast response, high contrast, high color gamut and flexible display.

SUMMARY

In one aspect, an array substrate is provided. The array substrate includes: a plurality of sub-pixels, and at least one photosensitive detection assembly, each photosensitive detection assembly of the at least one photosensitive detection assembly corresponding to at least one sub-pixel. The at least one photosensitive detection assembly includes: a photosensitive element configured to detect a luminance of a corresponding sub-pixel, and output a light detection signal according to the luminance of the corresponding sub-pixel, and a signal reading element coupled to the photosensitive element and a first reading signal line, wherein the signal reading element is configured to read the light detection signal, and output a first detection signal to the first reading signal line according to the light detection signal.

In some embodiments, the photosensitive element includes a first transistor and a photosensitive diode. A control electrode of the first transistor is coupled to a first control terminal, a first electrode of the first transistor is coupled to a first voltage terminal, and a second electrode of the first transistor is coupled to a negative electrode of the photosensitive diode. A positive electrode of the photosensitive diode is coupled to a second voltage terminal, and the negative electrode of the photosensitive diode is further coupled to the signal reading element.

In some embodiments, the light detection signal includes a light detection voltage signal. The signal reading element includes a voltage follower circuit, wherein the voltage follower circuit is configured to read the light detection voltage signal, and output the first detection signal to the first reading signal line according to the light detection voltage signal, and the first detection signal is a voltage following signal in phase with the light detection voltage signal.

In some embodiments, the voltage follower circuit includes a second transistor, a third transistor, and a current source. A control electrode of the second transistor is coupled to the photosensitive element, a first electrode of the second transistor is coupled to a third voltage terminal, and a second electrode of the second transistor is coupled to a first electrode of the third transistor and the first reading signal line. A control electrode of the third transistor is coupled to a second control terminal, and a second electrode of the third transistor is coupled to the current source. The current source is further coupled to a fourth voltage terminal, and the current source is configured to maintain a voltage on the second electrode of the second transistor in phase with a voltage on the control electrode of the second transistor when the third transistor is turned on.

In some embodiments, current sources of at east two voltage follower circuits are a same current source.

In some embodiments, each sub-pixel of the plurality of sub-pixels includes: a pixel driving circuit coupled to a scanning signal terminal and a data voltage terminal; and a light-emitting device coupled to the pixel driving circuit. The pixel driving circuit is configured to drive the light-emitting device to emit light under control of the scanning signal provided by the scanning signal terminal and the data voltage signal provided by the data voltage terminal.

In some embodiments, the array substrate further includes at least one electronic detection circuit, and each electronic detection circuit corresponds to a sub-pixel.

The electronic detection circuit is coupled to a third control terminal, a second reading signal line, and a pixel driving circuit in the sub-pixel, and the electronic detection circuit is configured to detect a light-emitting driving current output from the pixel driving circuit, and output a second detection signal to the second reading signal line according to the light-emitting driving current under control of the third control terminal.

In some embodiments, the electronic detection circuit each includes a fifth transistor. A control electrode of the fifth transistor is coupled to the third control terminal, a first electrode of the fifth transistor is coupled to the pixel driving circuit of the sub-pixel, and a second electrode of the fifth transistor is coupled to the second reading signal line.

In some embodiments, for an electronic detection circuit and a photosensitive detection assembly corresponding to a same sub-pixel, a second reading signal line coupled to the electronic detection circuit and a first reading signal line coupled to the photosensitive detection assembly are a same reading signal line. The electronic detection circuit and the photosensitive detection assembly corresponding to the same sub-pixel are further configured such that one of the electronic detection circuit and the photosensitive detection assembly corresponding to the same sub-pixel is selected to detect a light-emitting state of the sub-pixel and output a corresponding detection signal to the same reading signal line in a light-emitting period of the sub-pixel. Or, the electronic detection circuit and the photosensitive detection assembly corresponding to the same sub-pixel are further configured to separately detect the light-emitting state of the sub-pixel and output the corresponding detection signals to the reading signal line during different time periods of the light-emitting period of the sub-pixel.

In some embodiments, the pixel driving circuit includes a fourth transistor, a drive transistor, and a storage capacitor. A control electrode of the fourth transistor is coupled to the scanning signal terminal, a first electrode of the fourth transistor is coupled to the data voltage terminal, and a second electrode of the fourth transistor is coupled to a control electrode of the driving transistor and a first electrode of the storage capacitor. A first electrode of the driving transistor is coupled to a fifth voltage terminal, and a second electrode of the driving transistor is coupled to the light-emitting device and a second electrode of the storage capacitor.

In some embodiments, the first transistor in the photosensitive element is disposed in a same layer as a driving transistor in a corresponding sub-pixel. A driving transistor in each sub-pixel is coupled to the light-emitting device in a same sub-pixel through a first interlayer conductive layer. A first transistor in each photosensitive element is coupled to a photosensitive diode in the same photosensitive element through a second interlayer conductive layer, and is coupled to the first voltage terminal through a first signal line. The first interlayer conductive layer, the second interlayer conductive layer, and the first signal line are disposed in a same layer.

In some embodiments, the photosensitive diode in the photosensitive element is disposed on a side of the first transistor in the photosensitive element proximate to a light-emitting device of the at least one corresponding sub-pixel.

In some embodiments, in each photosensitive element, a positive electrode of the photosensitive diode is closer to a light-emitting device in a corresponding sub-pixel than a negative of the photosensitive diode. The positive electrode of the photosensitive diode is coupled to the second voltage terminal through a transparent conductive layer, the transparent conductive layer covers or partially covers a surface of the positive electrode of the photosensitive diode.

In some embodiments, the light-emitting device includes a first electrode and a second electrode disposed opposite to each other, and a light-emitting layer interposed between the first electrode and the second electrode. The transparent conductive layer is coupled to the second voltage terminal through a second signal line, and the first electrode of the light-emitting device is disposed in a same layer as the second signal line.

In some embodiments, the first electrode of the light-emitting device includes a reflective electrode. An orthographic projection of the reflective electrode on a plane where a surface of the transparent conductive layer is located does not cover or partially covers a corresponding transparent conductive layer.

In some embodiments, each sub-pixel of the plurality of sub-pixels corresponds to a photosensitive detection assembly. Or, the plurality of sub-pixels include at least one sub-pixel group, and each sub-pixel group of the at least one sub-pixel group corresponds to a photosensitive detection assembly. The sub-pixel group includes at least two sub-pixels disposed adjacent to each other.

In some embodiments, at least two signal reading elements are coupled to a same first reading signal line.

In another aspect, a display apparatus is provided. The display apparatus includes: the array substrate described above, and a detection integrated circuit coupled to at least one first reading signal line in the array substrate, the detection integrated circuit being configured to receive a first detection signal transmitted by the at least one first reading signal line.

In some embodiments, the detection integrated circuit includes at least one reading terminal. Each reading terminal of the at least one reading terminal is correspondingly coupled to at least one first reading signal line. The reading terminal is configured to receive a first detection signal transmitted by the at least one first reading signal line.

In some embodiments, the display apparatus further includes a controller coupled to the detection integrated circuit. The controller is configured to, according to each first detection signal received by the detection integrated circuit, determine an actual luminance of a corresponding sub-pixel, and control a data voltage terminal to provide a compensated data voltage signal to the corresponding sub-pixel according to a difference between the actual luminance and a corresponding target luminance, so as to calibrate a luminance of the corresponding sub-pixel.

In some embodiments, the detection integrated circuit is further coupled to at least one second reading signal line in the array substrate, and the detection integrated circuit is further configured to receive a second detection signal transmitted by the at least one second reading signal line, and the second detection signal is a detection signal output by at least one electronic detection circuit in the array substrate to the second reading signal line. The controller is further configured to, according to each second detection signal received by the detection integrated circuit, determine an actual light-emitting driving current of a corresponding sub-pixel, and control a data voltage terminal to provide a compensated data voltage signal to the corresponding sub-pixel according to a difference between an actual light-emitting driving current and a corresponding target light-emitting driving current, so as to calibrate a luminance of the corresponding sub-pixel.

In yet another aspect, a luminance calibration method applied to the display apparatus described above is provided. The luminance calibration method includes:

a luminance detection period including a photosensitive detection period; and in the photosensitive detection period, detecting, by a photosensitive element of each photosensitive detection assembly in the array substrate, a luminance of a corresponding sub-pixel, and outputting, by the photosensitive element, a light detection signal to a signal reading element according to the luminance of the corresponding sub-pixel; reading, by the signal reading element, a light detection signal, and outputting, by the signal reading element, a first detection signal to a first reading signal line according to the light detection signal; and transmitting, by the first reading signal line, the first detection signal to a detection integrated circuit. And a luminance calibration period including a photosensitive calibration period; and in the photosensitive calibration period, calibrating the luminance of the corresponding sub-pixel according to the first detection signal transmitted by the detection integrated circuit.

In some embodiments, sub-pixels corresponding to different photosensitive detection assemblies coupled to a same first reading signal line are driven in different time periods.

In some embodiments, the photosensitive detection period includes a voltage reset period and a charge integration period. Detecting, by the photosensitive element, the luminance of the corresponding sub-pixel, and outputting, by the photosensitive element, the light detection signal to the signal reading element according to the luminance of the corresponding sub-pixel, includes:

in the voltage reset period, a first transistor in the photosensitive element being turned on under control of a first control terminal; and a photosensitive diode in the photosensitive element being reverse biased under actions of voltage signals provided by a first voltage terminal and a second voltage terminal. And in the charge integration period, the first transistor being turned off under the control of the first control terminal; and outputting, by the photosensitive diode, a voltage signal from a negative electrode to the signal reading element as a light detection signal after receiving an illumination signal from the corresponding sub-pixel.

In some embodiments, the photosensitive detection period further includes a signal reading period. Reading, by the signal reading element, the light detection signal, and outputting, by the signal reading element, the first detection signal to the first reading signal line according to the light detection signal, includes:

In the signal reading period, reading, by the signal reading element, the light detection signal under control of a second control terminal, and outputting, by the signal reading element, a voltage following signal in phase with the light detection signal as a first detection signal to the first reading signal line.

In some embodiments, the luminance detection period further includes an electronic detection period. In the electronic detection period, each electronic detection circuit in the array substrate detects a light-emitting driving current of a corresponding sub-pixel under control of a third control terminal, and outputs a second detection signal to a second reading signal line according to the light-emitting driving current; and the second reading signal line transmits the second detection signal to the detection integrated circuit. And the luminance calibration period further includes an electronic calibration period. In the electronic calibration period, the luminance of the corresponding sub-pixel is calibrated according to the second detection signal transmitted by the detection integrated circuit.

In some embodiments, sub-pixels corresponding to different electronic detection circuits coupled to a same second reading signal line are driven in different time periods.

In some embodiments, a luminance calibration cycle includes an electronic detection period and an electronic calibration period. Or, a luminance calibration cycle includes a photosensitive detection period and a photosensitive calibration period. Or, a luminance calibration cycle includes an electronic detection period, an electronic calibration period, a photosensitive detection period, and a photosensitive calibration period. The electronic detection period and the photosensitive detection period are in different time periods of the luminance calibration cycle, and the electronic calibration period and the photosensitive calibration period are in different time periods of the luminance calibration cycle.

BRIEF DESCRIPTION OF THE DRAWINGS

In order to describe technical solutions in some embodiments of the present disclosure more clearly, the accompanying drawings to be used in the description of disclosure will be introduced briefly. Obviously, the accompanying drawings to be described below are merely some embodiments of the present disclosure, and a person of ordinary skill in the art can obtain other drawings according to these drawings without paying any creative effort.

FIG. 17 is a schematic diagram showing a structure of a display apparatus, according to some embodiments of the present disclosure;

FIG. 18 is a flow diagram of a luminance calibration method of a display apparatus, according to some embodiments of the present disclosure;

FIG. 19 is a timing diagram of a luminance calibration method of a display apparatus, according to some embodiments of the present disclosure;

FIG. 20 is another flow diagram of a luminance calibration method of a display apparatus, according to some embodiments of the present disclosure;

DETAILED DESCRIPTION

The technical solutions in some embodiments of the present disclosure will be described clearly and completely with reference to the accompanying drawings in some embodiments of the present disclosure. Obviously, the described embodiments are merely some but not all of embodiments of the present disclosure. All other embodiments made on the basis of some embodiments of the present disclosure by a person of ordinary skill in the art without paying any creative effort shall be included in the protection scope of the present disclosure.

A plurality of sub-pixels of an organic light-emitting diode (OLED) display apparatuses each are provided with a driving transistor configured to provide a light-emitting driving current to a light-emitting device. The driving transistor in each sub-pixel is prone to a threshold voltage drift and an electron mobility fluctuation due to a manufacturing process, materials, and a structural design of the driving transistor. Thereby, an actual luminance of each sub-pixel in the OLED display apparatus is deviated from a target luminance that the sub-pixel should have. Further, it is difficult for an image displayed by the OLED display apparatus to satisfy display requirements. Therefore, before the OLED display apparatus is shipped from a factory, or in an initialization period of the OLED display apparatus, or after the OLED display apparatus is used for a period of time, it is necessary to calibrate and compensate the luminances of sub-pixels in the OLED display apparatus.

Figure 1:
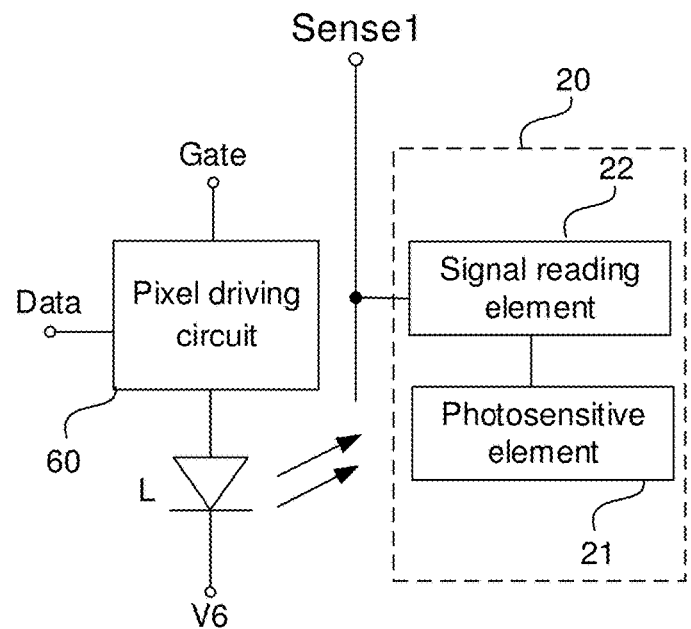
FIG. 1 is a schematic diagram showing a structure of a photosensitive detection assembly in an array substrate, according to some embodiments of the present disclosure.
Figure 3:
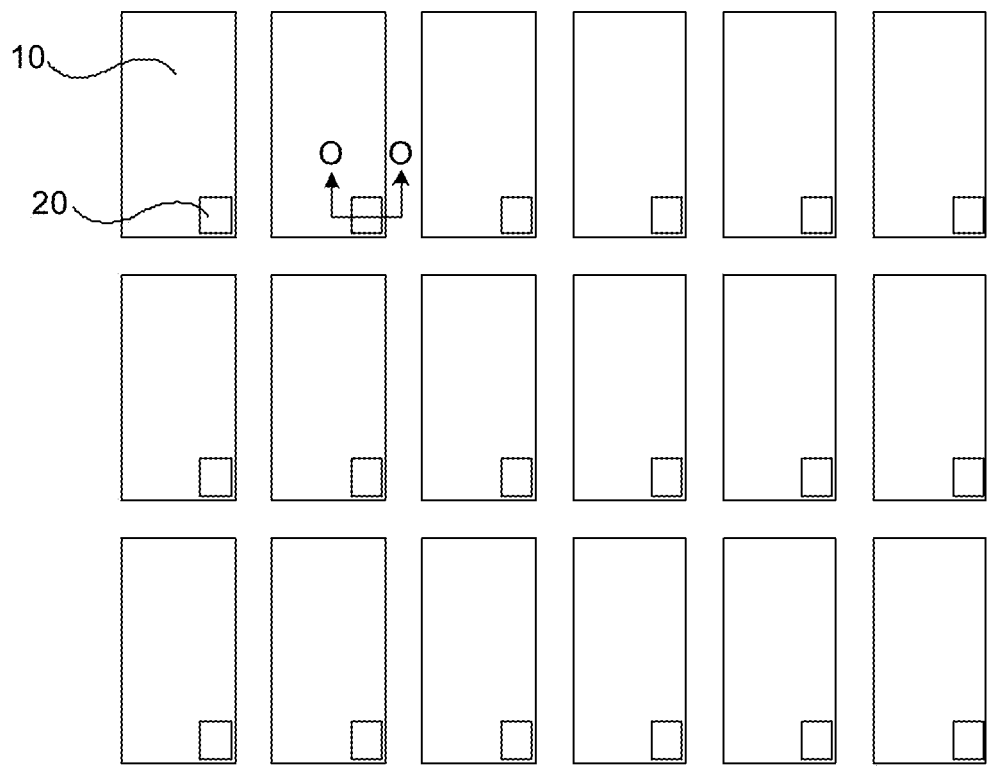
FIG. 3 is a diagram showing a corresponding relationship between photosensitive detection assemblies and sub-pixels in an array substrate, according to some embodiments of the present disclosure.

Based on this, some embodiments of the present disclosure provide an array substrate. Referring to FIG. 1 and FIG. 3, the array substrate includes a plurality of sub-pixels 10 and at least one photosensitive detection assembly 20. Each photosensitive detection assembly 20 of the at least one photosensitive detection assembly corresponds to at least one sub-pixel 10.

Referring to FIG. 1, the at least one photosensitive detection assembly 20 includes a photosensitive element 21 and a signal reading element 22. The photosensitive element 21 is configured to detect a luminance of a corresponding sub-pixel 10 and output a light detection signal according to the luminance of the sub-pixel 10. The signal reading element 22 is coupled to the photosensitive element 21 and a first reading signal line Sense1, and the signal reading element 22 is configured to read the light detection signal output by the photosensitive element 21, and output a first detection signal to the first reading signal line Sense1 according to the light detection signal.

It will be noted that the plurality of sub-pixels 10 included in the array substrate refer to a plurality of sub-pixels 10, luminances of which need to be detected, in the array substrate. The plurality of sub-pixels 10 are, for example, all of sub-pixels 10 for display. For another example, the plurality of the sub-pixels 10 are some of the sub-pixels 10 for display.

In the array substrate provided by some embodiments of the present disclosure, at least one photosensitive detection assembly 20 disposed corresponding to at least one sub-pixel 10 is integrated in the array substrate. Thus, when the luminance of each sub-pixel 10 need to be calibrated and compensated, an actual luminance of the light-emitting device in the sub-pixel 10 may be quickly and accurately detected by using a sensitive identification of light by a corresponding photosensitive element 21 in the photosensitive detection assembly 20, and the light detection signal determined according to the actual luminance is obtained.

Moreover, after the signal reading element 22 in the photosensitive detection assembly 20 effectively reads the light detection signal, the first detection signal for accurately reflecting the actual luminance of the light-emitting device in the corresponding sub-pixel 10 may be output to the first reading signal line Sense1 according to the light detection signal, so as to accurately calibrate and compensate the luminance of the sub-pixel 10 according to the first detection signal. For example, a data voltage signal to be provides to the sub-pixel 10 is adjusted in a targeted manner according to the first detection signal output by the photosensitive detection assembly 20, which may effectively compensate the threshold voltage drift and the electron mobility fluctuation of the driving transistor, so as to ensure that the actual luminance of the sub-pixel is consistent with the target luminance of the sub-pixel, thereby ensuring that the image displayed by the display apparatus may satisfy the display requirements, and the display apparatus has a good display effect.

In addition, since there are a plurality of influencing factors that cause the actual luminance of the sub-pixel 10 to be inconsistent with the target luminance of the sub-pixel 10, such as aging of a light-emitting layer and other structures, and a resistance drop of a power line, in some embodiments of the present disclosure, the luminance of the sub-pixel 10 is calibrated by using the method of detecting the actual luminance of the sub-pixel 10 described above, which may comprehensively consider the influencing factors of the luminance of the sub-pixel, thereby improving an accuracy of calibrating the luminance of the sub-pixel 10.

In some embodiments, there are a plurality of corresponding relationships between the photosensitive detection assemblies 20 and the sub-pixels 10. For example, the photosensitive detection assemblies and the sub-pixels having a corresponding relationships may be implemented as the following several structures, but are not limited thereto, and may be implemented as other structures apart from the following several structures. However, it will be noted that whether a photosensitive detection assembly 20 corresponds to a sub-pixel 10, or a single photosensitive detection assembly 20 corresponds to a plurality of sub-pixels 10, it is necessary to ensure that light emitted from each sub-pixel 10 is incident on the photosensitive element 21 in the photosensitive detection assembly 20 disposed corresponding to the sub-pixel.

Optionally, referring to FIG. 3, a photosensitive detection assembly 20 corresponds to a single sub-pixel 10. That is, different sub-pixels 10 respectively correspond to different photosensitive detection assemblies 20.

Here, a photosensitive detection assembly 20 corresponds to a sub-pixel 10. In a process of detecting and calibrating the actual luminances of the plurality of sub-pixels 10, the plurality of sub-pixels 10 may separately light up or all light up. For example, when the plurality of sub-pixels 10 all light up, photosensitive detection components 20 simultaneously detect the luminances of the sub-pixels 10, which may save time for detecting the luminance.

Figure 6:
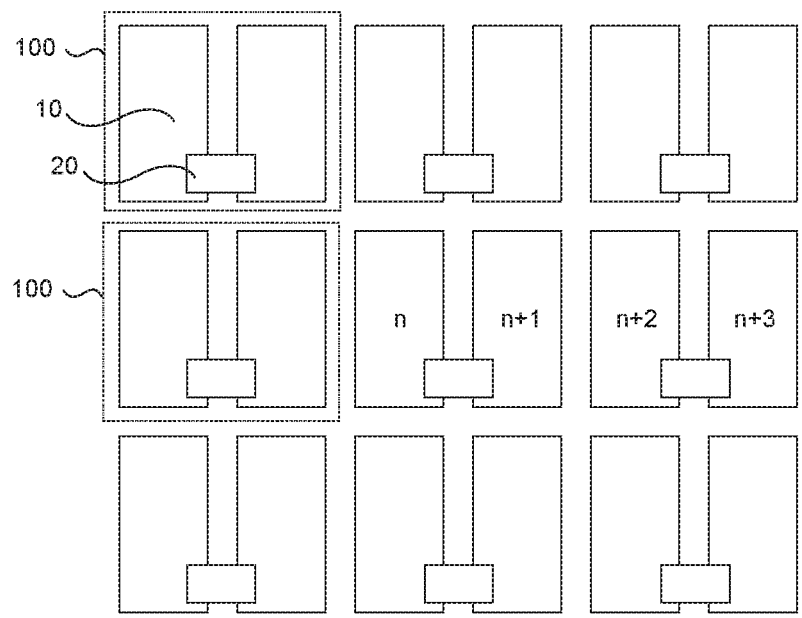
FIG. 6 is a diagram showing another corresponding relationship between photosensitive detection assemblies and sub-pixels in an array substrate, according to some embodiments of the present disclosure.
Figure 7:
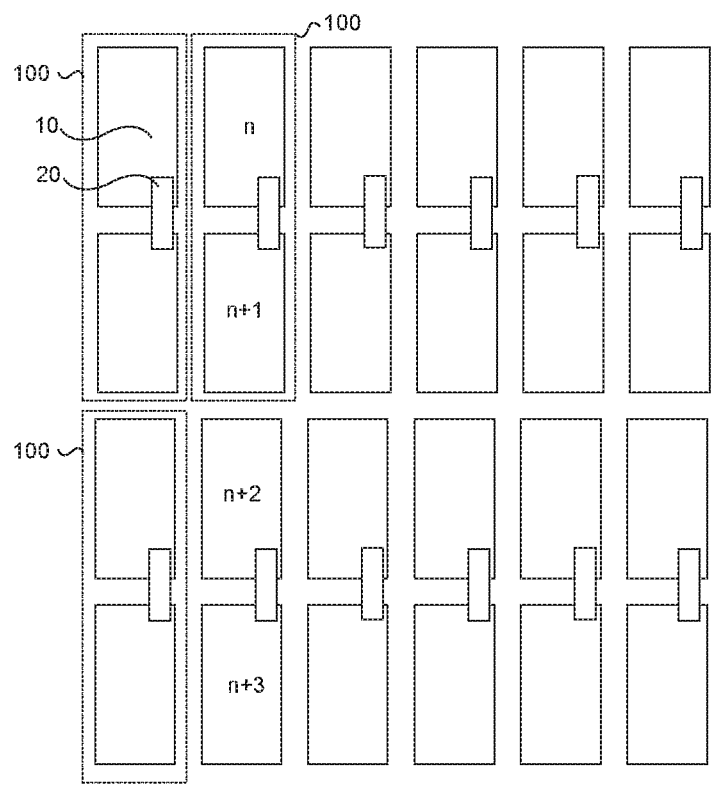
FIG. 7 is a diagram showing yet another corresponding relationship between photosensitive detection assemblies and sub-pixels in an array substrate, according to some embodiments of the present disclosure.
Figure 8:
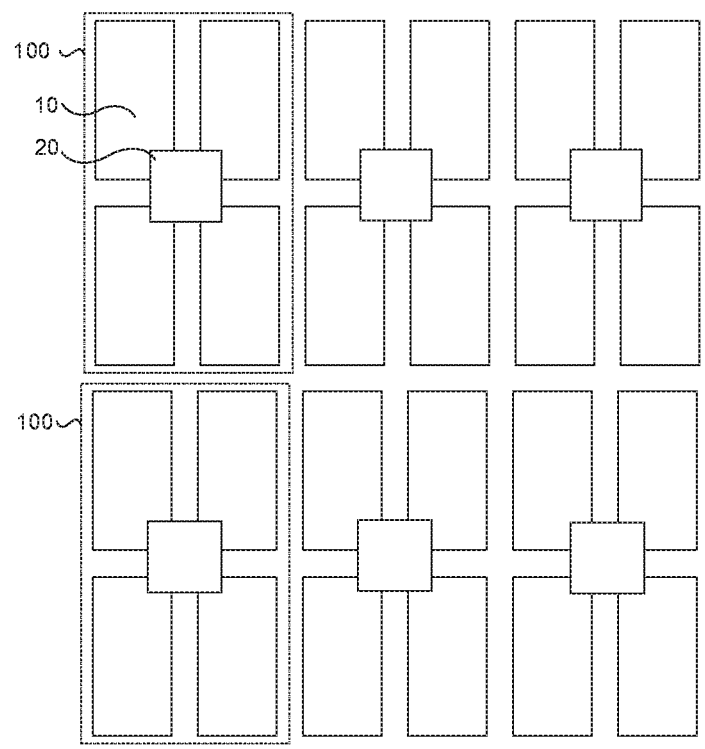
FIG. 8 is a diagram showing yet another corresponding relationship between photosensitive detection assemblies and sub-pixels in an array substrate, according to some embodiments of the present disclosure.

Optionally, referring to FIGS. 6 to 8, a photosensitive detection assembly 20 corresponds to two or more sub-pixels 10. In this case, the plurality of sub-pixels 10 may be divided into at least one sub-pixel group 100. Each sub-pixel group 100 corresponds to a photosensitive detection assembly 20, and includes at least two sub-pixels 10 disposed adjacent to each other.

Here, a photosensitive detection assembly 20 is disposed corresponding to multiple sub-pixels 10. Since the photosensitive detection assembly 20 will occupy a larger space in the array substrate, a setting method in which a single photosensitive detection assembly 20 is disposed corresponding to multiple sub-pixels 10 may reduce a total number of the photosensitive detection assemblies 20 disposed in the array substrate, thereby contributing to an increase in an aperture ratio of the array substrate.

It will be understood that sub-pixels 10 of the array substrate are typically arranged in an array. In some embodiments described above, the setting method in which a photosensitive detection assembly 20 is disposed corresponding to multiple sub-pixels 10 may be implemented by referring to any method of the following three methods.

In a first method, referring to FIG. 6, in a row direction in which sub-pixels 10 are disposed, two adjacent sub-pixels 10 form a sub-pixel group 100, and each sub-pixel group 100 corresponds to a photosensitive detection assembly 20. That is, in the row direction, an nth sub-pixel 10 and a (n+1)th sub-pixel 10 form a sub-pixel group 100, and the nth sub-pixel 10 and the (n+1)th sub-pixel 10 share a same photosensitive detection assembly 20. A (n+2)th sub-pixel 10 and a (n+3)th sub-pixel 10 form another sub-pixel group 100, and the (n+2)th sub-pixel 10 and the (n+3)th sub-pixel 10 share a same photosensitive detection assembly 20, and so on.

In a second method, referring to FIG. 7, in a column direction in which sub-pixels 10 are disposed, two adjacent sub-pixels 10 form a sub-pixel group 100, and each sub-pixel group 100 corresponds to a photosensitive detection assembly 20. That is, in the column direction, an nth sub-pixel 10 and a (n+1)th sub-pixel 10 form a sub-pixel group 100, and the nth sub-pixel 10 and the (n+1)th sub-pixel 10 share a same photosensitive detection assembly 20. A (n+2)th sub-pixel 10 and a (n+3)th sub-pixel 10 form another sub-pixel group 100, and the (n+2)th sub-pixel 10 and the (n+3)th sub-pixel 10 share a same photosensitive detection assembly 20, and so on.

Since sub-pixels 10 in a same row in the array substrate are coupled to a same gate line, and the array substrate usually scans the sub-pixels row by row, a method in which two sub-pixels 10 in the column direction share a same photosensitive detection assembly 20, the luminances of sub-pixels 10 in a row may be detected during a process of calibrating and detecting the luminance of the sub-pixel 10, thereby saving the time for detecting the luminances of respective sub-pixels.

In a third method, referring to FIG. 8, four sub-pixels 10 arranged in a shape like a Chinese character "田" form a sub-pixel group 100, and each sub-pixel group 100 corresponds to a same photosensitive detection assembly 20.

Here, a setting method in which a photosensitive detection assembly 20 is disposed corresponding to four sub-pixels 10 may further reduce the total number of the photosensitive detection assemblies 20 in the array substrate. In addition, the setting method in which a photosensitive detection assembly 20 is disposed corresponding to four sub-pixels 10 is applicable to a display panel having a large number of pixels per inch (PPI).

It will be noted that some embodiments of the present disclosure do not limit types of sub-pixels 10 forming a pixel units in the OLED display apparatus. Each pixel unit is, for example, composed of a red sub-pixel 10 (R), a green sub-pixel 10 (G), and a blue sub-pixel 10 (B). For another example, each pixel unit is composed of a red sub-pixel 10 (R), a green sub-pixel 10 (G), a blue sub-pixel 10 (B) and a white sub-pixel 10 (W). Here, it will be understood that the division of the sub-pixels 10 to the sub-pixel groups 100 in the array substrate may be achieved according to the colors of the sub-pixels 10. For example, in a case where the pixel unit is composed of a red sub-pixel 10 (R), a green sub-pixel 10 (G), a blue sub-pixel 10 (B) and a white sub-pixel 10 (W), referring to FIG. 8, each sub-pixel group 100 is composed of four sub-pixels, and the four sub-pixels are a red sub-pixel (R), a green sub-pixel (G), a blue sub-pixel (B) and a white sub-pixel ON).

In addition, it will be further understood that, if a photosensitive detection assembly 20 is disposed corresponding to multiple sub-pixels 10, in the process of detecting the luminances of the sub-pixel 10, a photosensitive detection assembly 20 may be used to detect the luminances of the different sub-pixels 10 in a time-sharing manner. That is to say, the luminances of the different sub-pixels 10 corresponding to the photosensitive detection assembly 20 need to be detected in different time periods.

For example, each sub-pixel group 100 is composed of a red sub-pixel and an adjacent green sub-pixel, and a sub-pixel group 100 is disposed corresponding to a photosensitive detection assembly 20. The red sub-pixel light up in a first time period, an actual luminance of the red sub-pixel is detected, and a first detection signal corresponding to the red sub-pixel is output to a corresponding first reading signal line Sense1. The green sub-pixel lights up in a second time period, an actual luminance of the green sub-pixel is detected, and a first detection signal corresponding to the green sub-pixel is output to the corresponding first reading signal line Sense1. Therefore, the red sub-pixel and the green sub-pixel in each sub-pixel group 100 are separately detected in different time periods, which may ensure that the photosensitive element 21 in the photosensitive detection assembly 20 may detect the luminances of different sub-pixels 10 in the sub-pixel group 100 in different detection time periods, so that different first detection signals corresponding to different sub-pixels in a sub-pixel group 100 may be distinguished from each other.

In some embodiments, in the photosensitive detection assembly 20, the light detection signal output by the photosensitive element 21 to the signal reading element 22 may be output as a light detection current signal or a light detection voltage signal. Correspondingly, the first detection signal output by the signal reading element 22 according to the light detection signal may also be output as a current signal or a voltage signal.

Since a length of the first reading signal line Sense1 in the array substrate is generally long, and the current signal is weaker than the voltage signal, the current signal is easily interfered in a long-distance signal transmission, which may affect the signal transmission. In some embodiments of the present disclosure, the light detection signal output by the photosensitive element 21 is a light detection voltage signal. The signal reading element 22 is a voltage follower or any other reading element configured to read the voltage signal. The first detection signal output by the signal reading element 22 is a voltage signal. Thus, an anti-interference capability of the first detection signal may be enhanced without changing the length of the first reading signal line Sense1, thereby ensuring an accurate transmission of the first detection signal and improving an effect of the luminance calibration for the corresponding sub-pixel 10.

Figure 2:
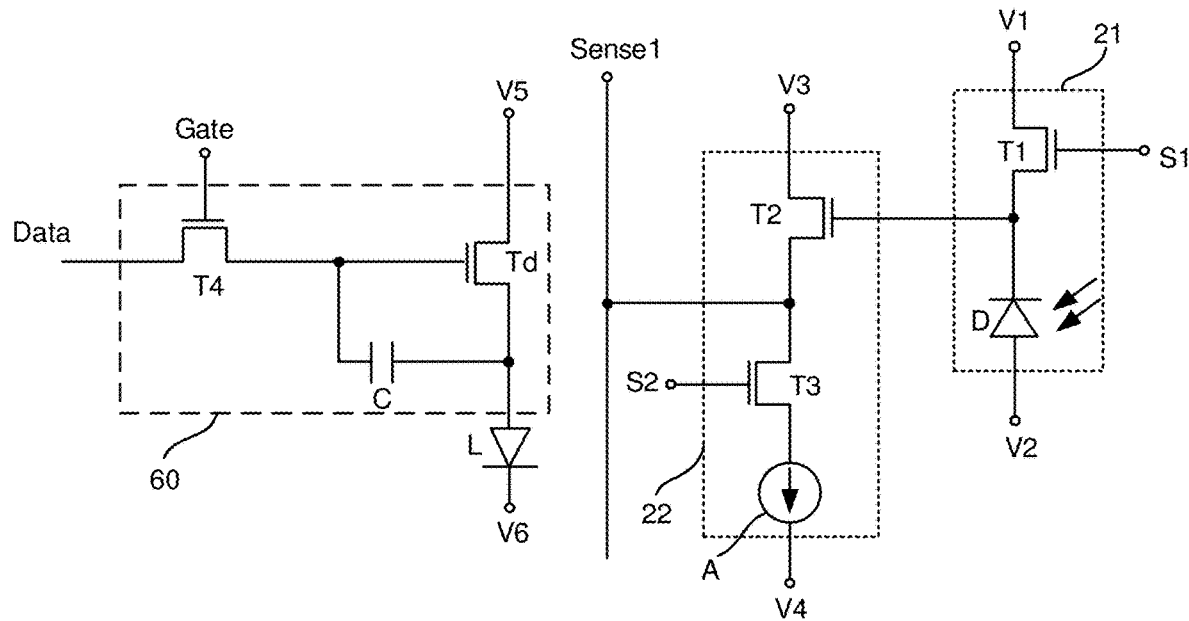
FIG. 2 is a schematic diagram showing another structure of a photosensitive detection assembly in an array substrate, according to some embodiments of the present disclosure.

Based on this, optionally, referring to FIG. 2, the photosensitive element 21 includes a first transistor T1 and a photosensitive diode D. A control electrode of the first transistor T1 is coupled to a first control terminal S1, a first electrode of the first transistor T1 is coupled to a first voltage terminal V1, and a second electrode of the first transistor T1 is coupled to a negative electrode of the photosensitive diode D. A positive electrode of the photosensitive diode D is coupled to a second voltage terminal V2, and the negative electrode of the photosensitive diode D is further coupled to the signal reading element 22.

When the first transistor T1 in the photosensitive element 21 is turned on under control of the first control terminal S1, a voltage signal provided by the first voltage terminal V1 is higher than a voltage signal provided by the second voltage terminal V2, and the photosensitive diode D is reverse biased under actions of the voltage signals provided by the first voltage terminal V1 and the second voltage terminal V2, so that the photosensitive diode D is in a working state and may detect the luminance of the corresponding sub-pixel. When the first transistor T1 is turned off under the control of the first control terminal S1, the photosensitive diode receives illumination of the corresponding sub-pixel 10, a potential at the negative electrode of the photosensitive diode D decreases, and a voltage signal from the negative electrode of the photosensitive diode D is output to the signal reading element 22 as a light detection voltage signal. Here, It will be understood that, the light detection voltage signal having a larger value from the photosensitive element 21 may be output by adjusting magnitudes of the voltage signals provided by the first voltage terminal V1 and the second voltage terminal V2, thereby facilitating the signal reading component 22 to better identify and read the light detection voltage signal.

With continued reference to FIG. 2, the signal reading component 22 is a voltage follower circuit. The voltage follower circuit is configured to read the light detection voltage signal output by the photosensitive element 21, and output a first detection signal to the first reading signal line Sense1 according to the light detection voltage signal. Here, the first detection signal is a voltage following signal that is in phase with the light detection voltage signal.

For example, the voltage follower circuit includes a second transistor T2, a third transistor T3, and a current source A. A control electrode of the second transistor T2 is coupled to the photosensitive element 21 (the negative electrode of the photosensitive diode D), a first electrode of the second transistor T2 is coupled to a third voltage terminal V3, and a second electrode of the second transistor T2 is coupled to a first electrode of the third transistor T3 and the first reading signal line Sense1. A control electrode of the third transistor T3 is coupled to A second control terminal S2, and a second electrode of the third transistor T3 is coupled to the current source A. The current source A is further coupled to a fourth voltage terminal V4, and the current source A is configured to maintain a voltage on the second electrode of the second transistor T2 in phase with a voltage on the control electrode of the second transistor T2 when the third transistor T3 is turned on.

When the second transistor T2 and the third transistor T3 are turned on, the second transistor T2 is in an amplified working state under a combined action of the third voltage terminal V3, the fourth voltage terminal V4, and a voltage on the negative electrode of the photosensitive diode D (the light detection voltage signal). The current source A makes a current of a circuit between the third voltage terminal V3 and the fourth voltage terminal V4 be constant. That is, a current flowing through the second transistor T2 remains unchanged.

In this case, a current between the first electrode and the second electrode of the second transistor T2 is $$I = \frac{1}{2}\mu C_{ox}\frac{W}{L}(V_{gs} - V_{th})^2,$$

wherein $C_{ox}$ is a dielectric constant of a channel insulating layer of the second transistor T2, $\mu$ is a channel carrier mobility of the second transistor T2, $$\frac{W}{L}$$

is a width-to-length ratio of the second transistor T2, $V_{gs}$ is a voltage difference between the control electrode and the second electrode of the second transistor T2, and $V_{th}$ is a threshold voltage of the second transistor T2. As for a second transistor T2, W and L are constant values, and $C_{ox}$ and p are constants. Therefore, when I and $V_{th}$ remain unchanged, $V_{gs}$ also remains unchanged. Therefore, the voltage difference between the control electrode and the second electrode of the second transistor T2 is constant. That is, the voltage on the second electrode of the second transistor T2 follows the voltage on the control electrode of the second transistor T2. That is, a voltage signal output from the second electrode of the second transistor T2 to the first reading signal line Sense1 is in phase with a light detection voltage signal received by the control electrode of the second transistor T2. Thus, the light detection voltage signal output by the photosensitive element 21 may be known through a first detection signal received by the first reading signal line Sense1, thereby determining the luminance of the corresponding sub-pixel 10.

It will be added that, a magnitude of the light detection voltage signal output by the photosensitive element 21 may be adjusted by adjusting the magnitudes of the voltage signals provided by the first voltage terminal V1 and the second voltage terminal V2. In addition, a magnitude of the first detection signal output by the signal reading element 22 according to the light detection voltage signal may be effectively adjusted by adjusting the magnitudes of voltage signals provided by the third voltage terminal V3 and the fourth voltage terminal V4 (for example, a voltage signal of 10V or 15V is input via V3, and a voltage signal of −2V is input via V4). Based on this, in some embodiments of the present disclosure, after the signal reading element 22 is controlled to output a larger first detection signal, the anti-interference capability of the first detection signal may be enhanced without changing the length of the first reading signal line Sense1, thereby ensuring the accurate transmission of the first detection signal, and improving the effect of luminance calibration for the corresponding sub-pixel 10.

In some embodiments, the signal reading element 22 is a voltage follower circuit, and different voltage follower circuits share a current source A. That is, the current sources A of at least two voltage follower circuits are the same current source A, which may reduce a total number of the current sources A used in the array substrate, and reduce a ratio of volumes of the current sources A occupied in the array substrate.

Figure 9:
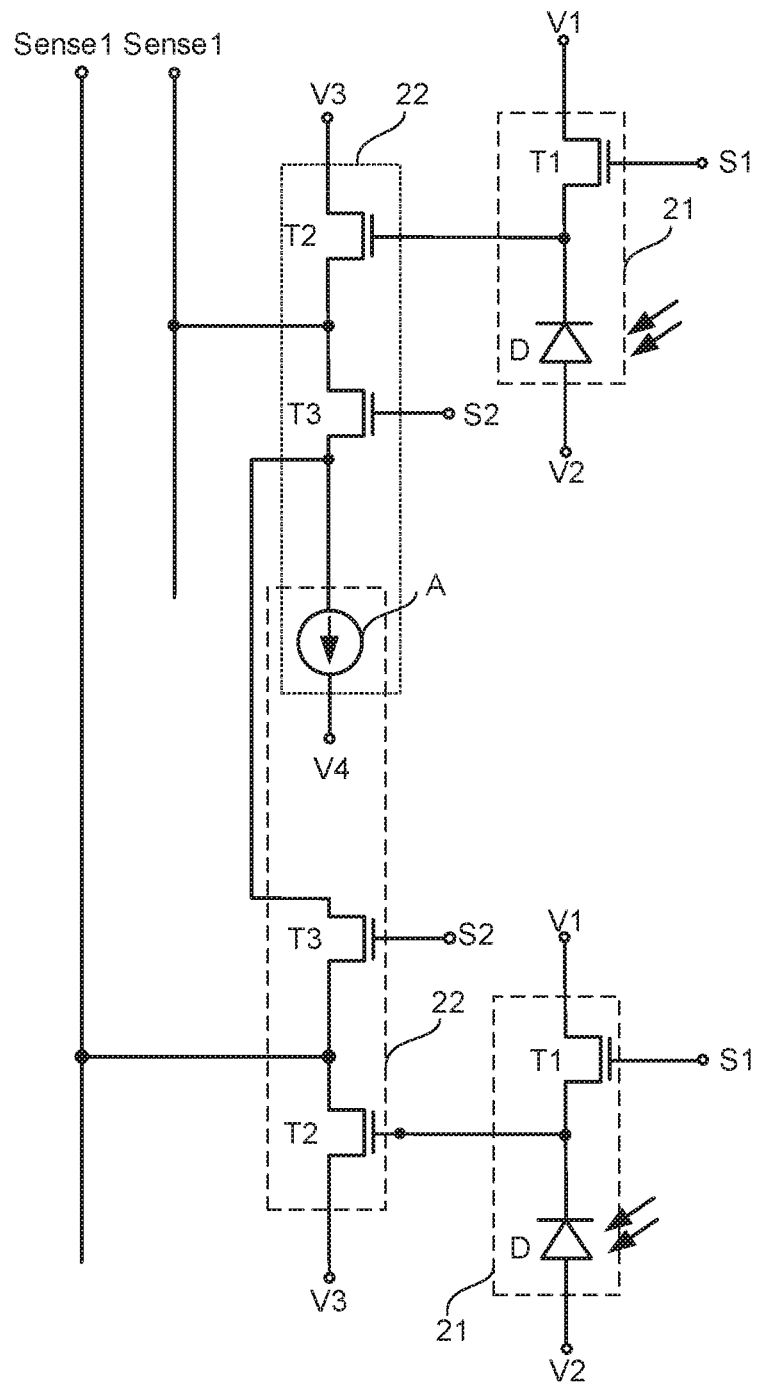
FIG. 9 is a schematic diagram showing yet another structures of photosensitive detection assemblies in an array substrate, according to some embodiments of the present disclosure.
Figure 10:
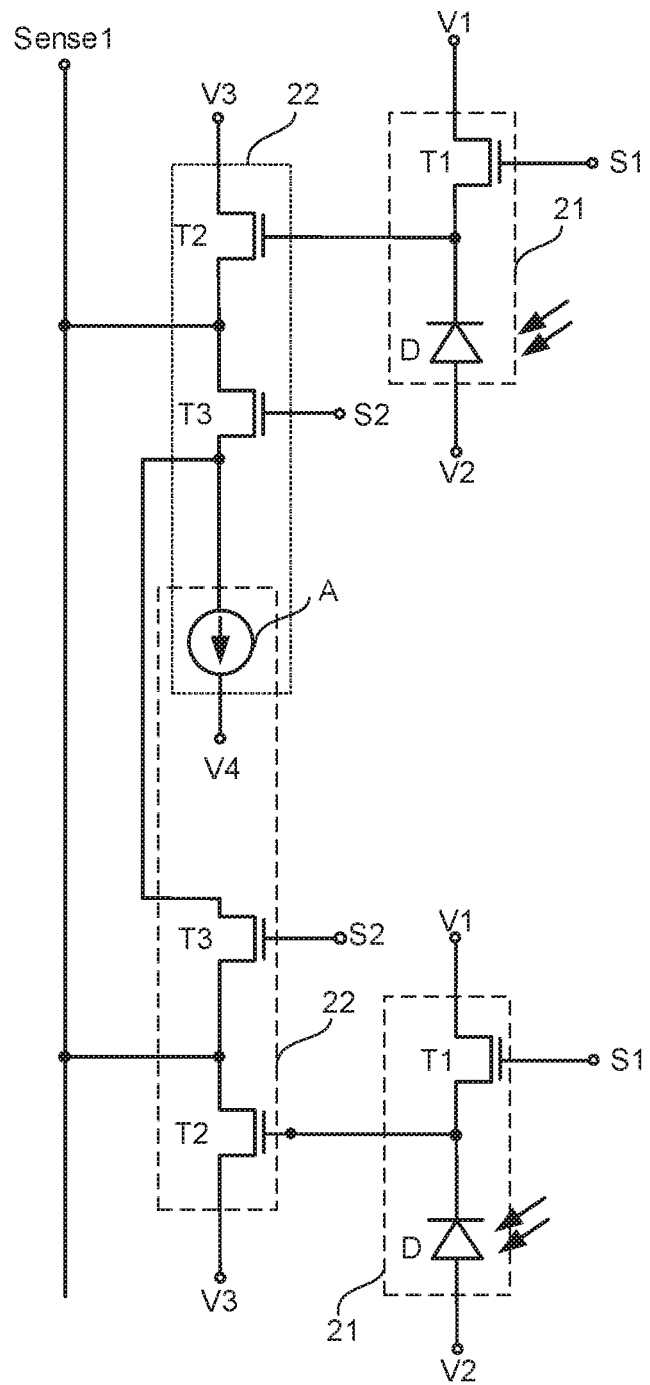
FIG. 10 is a schematic diagram showing yet another structures of photosensitive detection assemblies in an array substrate, according to some embodiments of the present disclosure.

For example, referring to FIG. 9 and FIG. 10, the signal reading elements 22 in photosensitive detection assemblies 20 disposed corresponding to sub-pixels 10 in a same column share a same current source A. Of course, it is also permissible that the signal reading elements 22 in photosensitive detection assemblies 20 disposed corresponding to sub-pixels 10 in a same row share a same current source A.

It is worth mentioning that, the current source may be disposed in the array substrate, or the current source may be disposed outside of the array substrate and is connected to a component in the array substrate through a wire. In a case where the current source is located outside the array substrate, a volume of the array substrate may be reduced.

In some embodiments, different signal reading elements 22 are coupled to a same first reading signal line Sense1. For example, at least two signal reading elements 22 are coupled to a same first reading signal line Sense1. Thus, a total number of the reading signal lines used in the array substrate may be reduced, thereby reducing a wiring difficulty of the array substrate.

Figure 11:
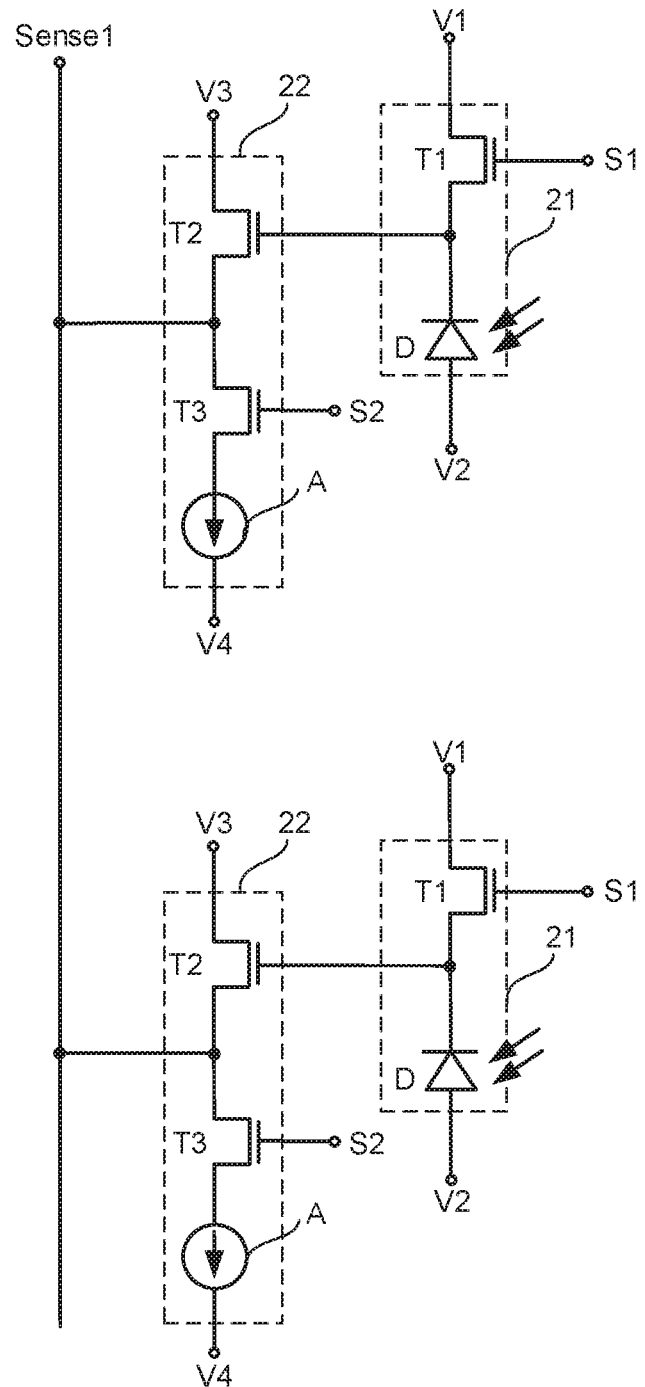
FIG. 11 is a schematic diagram showing yet another structures of photosensitive detection assemblies in an array substrate, according to some embodiments of the present disclosure.

For example, referring to FIG. 10 and FIG. 11, signal reading elements 22 of photosensitive detection assemblies 20 disposed corresponding to sub-pixels 10 in a same column are coupled to a same first reading signal line Sense1. Here, the sub-pixels 10 in the same column refer to sub-pixels 10 in a column that are coupled to a same data signal line. Of course, it is also permissible that signal reading elements 22 of photosensitive detection assemblies 20 disposed corresponding to sub-pixels 10 in a same row are coupled to a same first reading signal line Sense1. Here, the sub-pixels 10 in the same row refer to sub-pixels 10 in a row that are coupled to a same scanning signal line.

In addition, it is also permissible that signal reading elements 22 in all the photosensitive detection assemblies 20 in the array substrate share a current source A, or the signal reading elements 22 in all the photosensitive detection assemblies 20 in the array substrate are coupled to the same first read signal line Sense1.

It will be understood that, the manner in which different signal reading elements 22 share a same current source A and a manner in which different signal reading elements 22 are coupled to a same first reading signal line Sense1 may be simultaneously applied in the array substrate, or either one of the two manners is selected to be applied in the array substrate.

It will be noted that, whether different signal reading elements 22 share a same current source A or different signal reading elements 22 are coupled to a same first reading signal line Sense1, when one of the above cases occurs, the luminance of each corresponding sub-pixel 10 will be detected by means of a time-sharing detection. That is, the luminances of sub-pixels 10 corresponding to the same current source A or the same first reading signal line Sense1 are detected one by one in different time periods.

Figure 12:
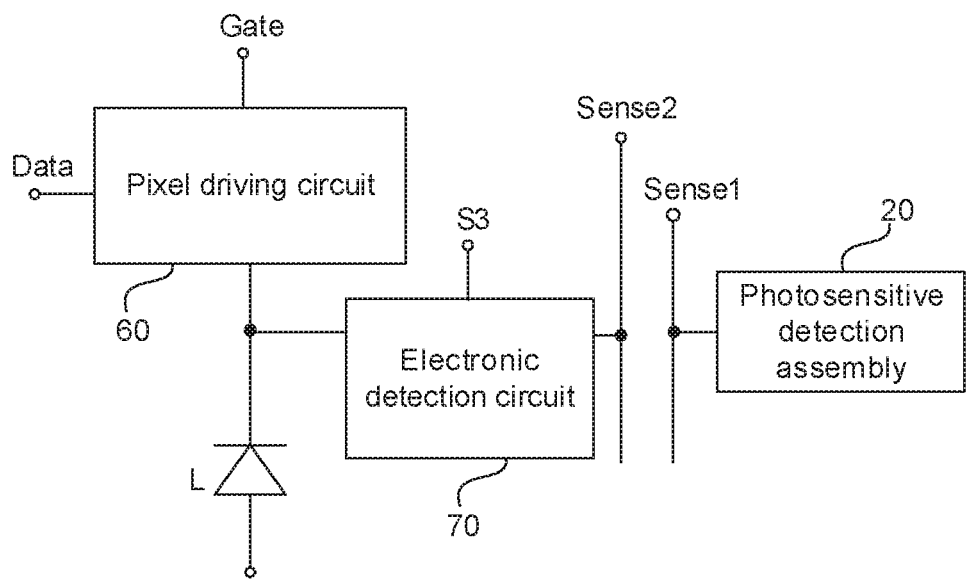
FIG. 12 is a schematic diagram showing structures of photosensitive detection assemblies and an electronic detection circuit in an array substrate, according to some embodiments of the present disclosure.
Figure 13:
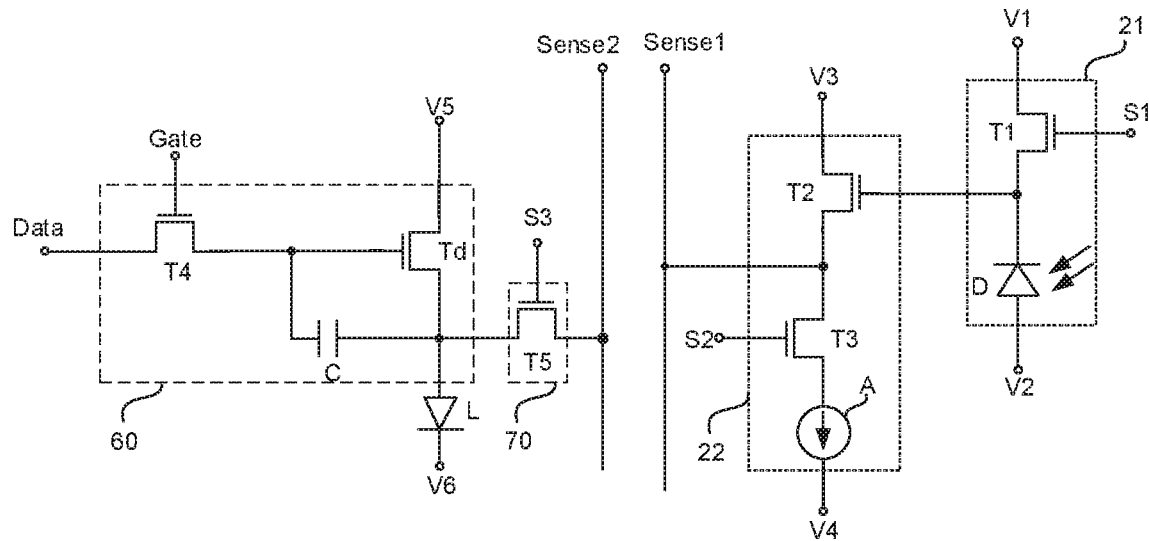
FIG. 13 is a schematic diagram showing another structure of a photosensitive detection assembly and another structure of an electronic detection circuit in an array substrate, according to some embodiments of the present disclosure.

It is worth mentioning that, referring to FIG. 12 and FIG. 13, in some embodiments of the present disclosure, each sub-pixel 10 includes a pixel driving circuit 60 and a light-emitting device L. The pixel driving circuit 60 is coupled to a scanning signal terminal Gate and a data voltage terminal Data. The light-emitting device L is coupled to the pixel driving circuit 60. The scanning signal terminal Gate is configured to provide a scanning signal. The data voltage terminal Data is configured to provide a data voltage signal. The pixel driving circuit 60 is configured to drive the light-emitting device L in a same sub-pixel 10 to emit light under control of the scanning signal and the data voltage signal. Light that may be received by the photosensitive diode D in each photosensitive detection assembly 20 is light emitted by the light-emitting device L in the corresponding sub-pixel 10.

For example, referring to FIG. 13, in some embodiments, the pixel driving circuit 60 includes a fourth transistor T4, a driving transistor Td, and a storage capacitor C. A control electrode of the fourth transistor T4 is coupled to the scanning signal terminal Gate, a first electrode of the fourth transistor T4 is coupled to the data voltage terminal Data, and a second electrode of the fourth transistor T4 is coupled to a control electrode of the driving transistor Td and a first electrode of the storage capacitor C. A first electrode of the driving transistor Td is coupled to a fifth voltage terminal V5, and a second electrode of the driving transistor Td is coupled to the light-emitting device L and a second electrode of the storage capacitor C. The light-emitting device L is coupled to a sixth voltage terminal V6.

In addition to detecting the luminance of the sub-pixel 10 by using the photosensitive detection assembly 20, in some embodiments of the present disclosure, the luminances of the sub-pixels 10 may also be detected by using other detection methods. For example, referring to FIG. 12, in some embodiments, the array substrate further includes at least one electronic detection circuit 70. Each electronic detection circuit 70 corresponds to a sub-pixel. The electronic detection circuit 70 is coupled to a third control terminal S3, a second reading signal line Sense2, and a pixel driving circuit 60 of the sub-pixel. The electronic detection circuit 70 is configured to detect a light-emitting driving current output by the pixel driving circuit 60 under control of the third control terminal S3, and output a second detection signal to the second reading signal line Sense2 according to the light-emitting driving current. Thus, the luminances of the sub-pixels 10 in the array substrate may be effectively detected by using corresponding electronic detection circuits 70.

It will be added that, in a case where the photosensitive detection assembly 20 and the electronic detection circuit 70 are both provided in the array substrate, the electronic detection circuit 70 is used alone to detect the luminance of the corresponding sub-pixel 10. Or, the photosensitive detection assembly 20 is used alone to detect the luminance of the at least one corresponding sub-pixel 10. Or, the electronic detection circuit 70 and the photosensitive detection assembly 20 are used to detect the luminance of the corresponding sub-pixel 10 twice. For example, the electronic detection circuit 70 is used to detect the luminance of the corresponding sub-pixel 10 for a first time, and output the second detection signal to the second reading signal line Sense2. Thereafter, the photosensitive detection assembly 20 is used to detect the luminance of the corresponding sub-pixel 10 for the second time, and output the first detection signal to the first reading signal line Sense1. Therefore, an electronic detection and a photosensitive detection (i.e., two detections) of the luminance of the same sub-pixel 10 may increase an accuracy of detecting the luminance of the sub-pixel 10 and further improve an accuracy of calibrating the luminance of the sub-pixel 10.

The electronic detection circuit 70 is configured to detect a light-emitting driving current output by the pixel driving circuit 60. The electronic detection circuit 70 may have a plurality of structures. Optionally, referring to FIG. 13, the electronic detection circuit 70 includes a fifth transistor T5. A control electrode of the fifth transistor T5 is coupled to the third control terminal S3, a first electrode of the fifth transistor T5 is coupled to the pixel driving circuit 60 of the corresponding sub-pixel 10, and a second electrode of the fifth transistor T5 is coupled to the second reading signal line Sense2. The electronic detection circuit 70 includes a fifth transistor T5, and thus has a simple structure and is convenient to be used. Therefore, a structure and a wiring of the array substrate may be simplified.

It will be noted that some embodiments of the present disclosure do not limit types of the transistors in the elements described above. That is, the first transistor T1, the second transistor T2, the third transistor T3, the fourth transistor T4, the fifth transistor T5, and the driving transistor Td described above may be N-type transistors or P-type transistors. Some embodiments of the present disclosure are described by taking an example in which the transistors are N-type transistors. In addition, according to different conduction methods inside the transistors, the transistors in the pixel circuit described above may be divided into enhancement-mode transistors and depletion-mode transistors.

In addition, the first electrode of the transistor is a drain, and the second electrode of the transistor is a source. Or, the first electrode of the transistor is the source, and the second electrode of the transistor is the drain, which is not limited in some embodiments of the present disclosure.

Figure 14:
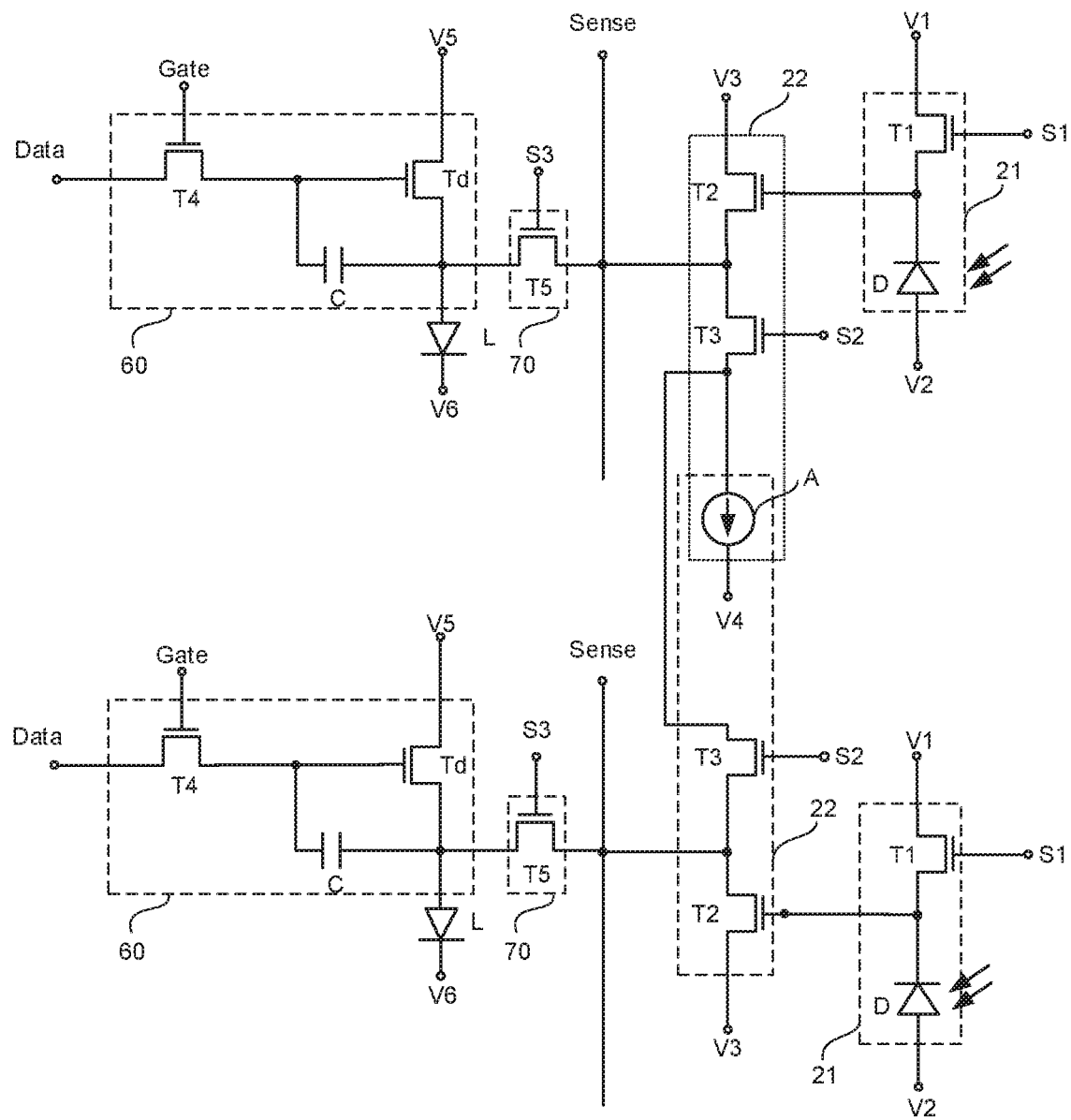
FIG. 14 is a schematic diagram showing structures of photosensitive detection assemblies and electronic detection circuits in an array substrate, according to some embodiments of the present disclosure.

In some embodiments, in the case where a photosensitive detection assembly 20 and an electronic detection circuit 70 are both provided in the array substrate, optionally, as for the electronic detection circuit 70 and the photosensitive detection assembly 20 corresponding to the same sub-pixel 10, the second reading signal line Sense2 coupled to the electronic detection circuit 70 and the first reading signal line Sense1 coupled to the photosensitive detection assembly 20 are different reading signal lines (for example, as shown in FIG. 13), or the electronic detection circuit 70 and the photosensitive detection assembly 20 share a same reading signal line Sense (as shown in FIG. 14).

For example, referring to FIG. 14, as for the electronic detection circuit 70 and the photosensitive detection assembly 20 corresponding to the same sub-pixel 10, the second reading signal line Sense2 coupled to the electronic detection circuit 70 and the first reading signal line Sense1 coupled to the photosensitive detection assembly 70 are the same reading signal line Sense.

The electronic detection circuit 70 and the photosensitive detection assembly 20 corresponding to the same sub-pixel 10 are further configured such that in a light-emitting period of the sub-pixel 10, one of the electronic detection circuit 70 and the photosensitive detection assembly 20 is selected to detect a light-emitting state of the sub-pixel 10 and output a corresponding detection signal to the reading signal line. For example, in the light-emitting period of the sub-pixel 10, the electronic detection circuit 70 is selected to detect a light-emitting driving current of the sub-pixel 10, and output a corresponding second detection signal to the reading signal line Sense. For another example, in the light-emitting period of the sub-pixel 10, the photosensitive detection assembly 20 is selected to detect the luminance of the sub-pixel 10, and output a corresponding first detection signal to the reading signal line Sense.

Of course, the electronic detection circuit 70 and the photosensitive detection assembly 20 corresponding to the same sub-pixel 10 are further configured to respectively detect the light-emitting state of the sub-pixel 10 and output the corresponding detection signal to the reading signal line during different time periods of the light-emitting period of the sub-pixel 10, which is also permissible. For example, in a first time period of the light-emitting period of the sub-pixel 10, the electronic detection circuit 70 is used to detect the light-emitting driving current of the sub-pixel 10, and output a corresponding second detection signal to the reading signal line Sense. In a second time period of the light-emitting period of the sub-pixel 10, the photosensitive detection assembly 20 is used to detect the luminance of the sub-pixel 10, and output a corresponding first detection signal to the reading signal line Sense.

The electronic detection circuit 70 and the photosensitive detection assembly 20 corresponding to the same sub-pixel 10 share the same reading signal line Sense, which may reduce the total number of the reading signal lines used in the array substrate, thereby reducing the wiring difficulty of the array substrate. In addition, the electronic detection circuit 70 and the photosensitive detection assembly 20 corresponding to the same sub-pixel 10 are used alternatively, or are used in different time periods, which may accurately transmit at least one type of detection signal by using a single reading signal line Sense.

Figure 15:
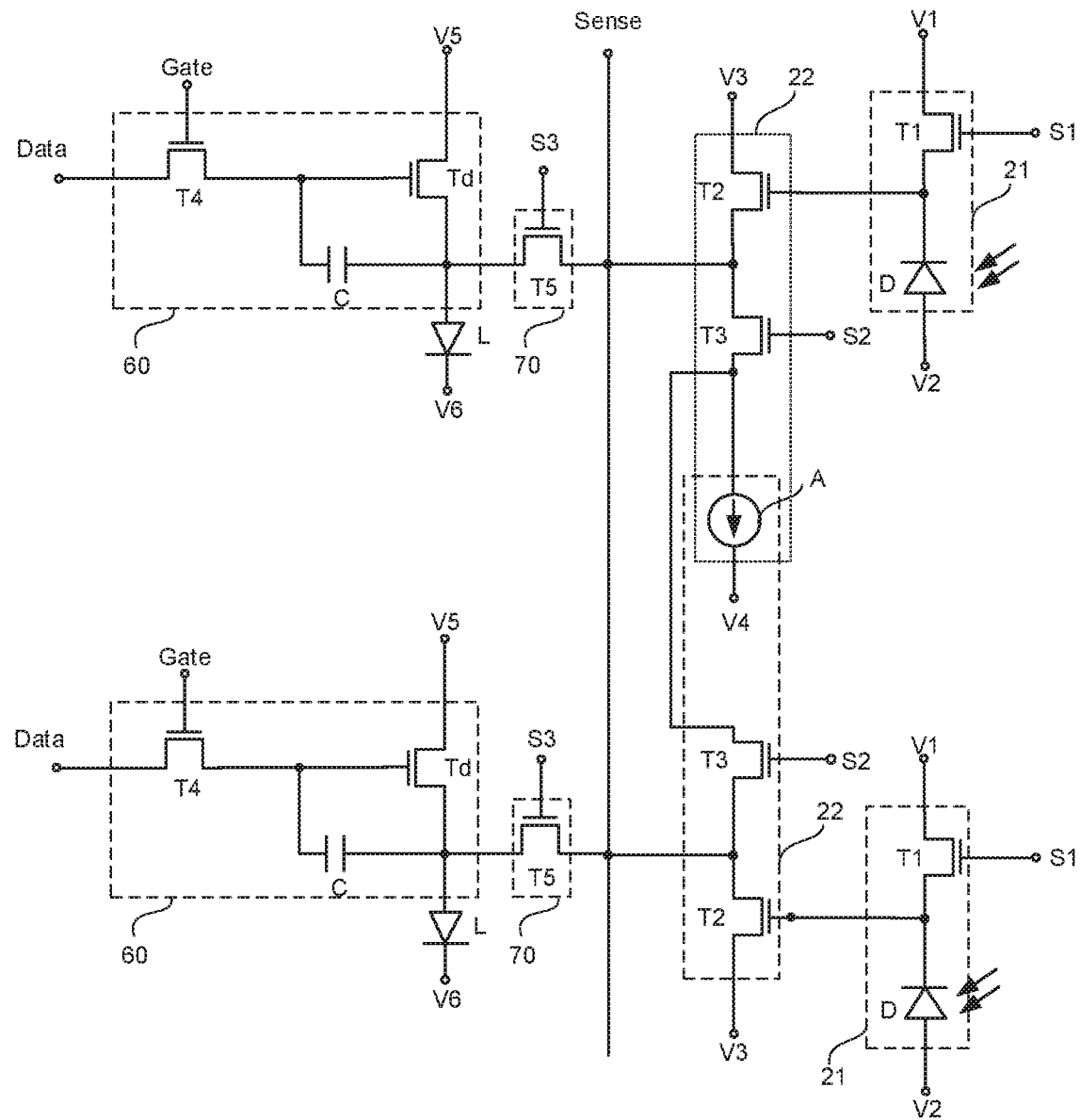
FIG. 15 is a schematic diagram showing yet another structures of photosensitive detection assemblies and electronic detection circuits in an array substrate, according to some embodiments of the present disclosure.
Figure 16:
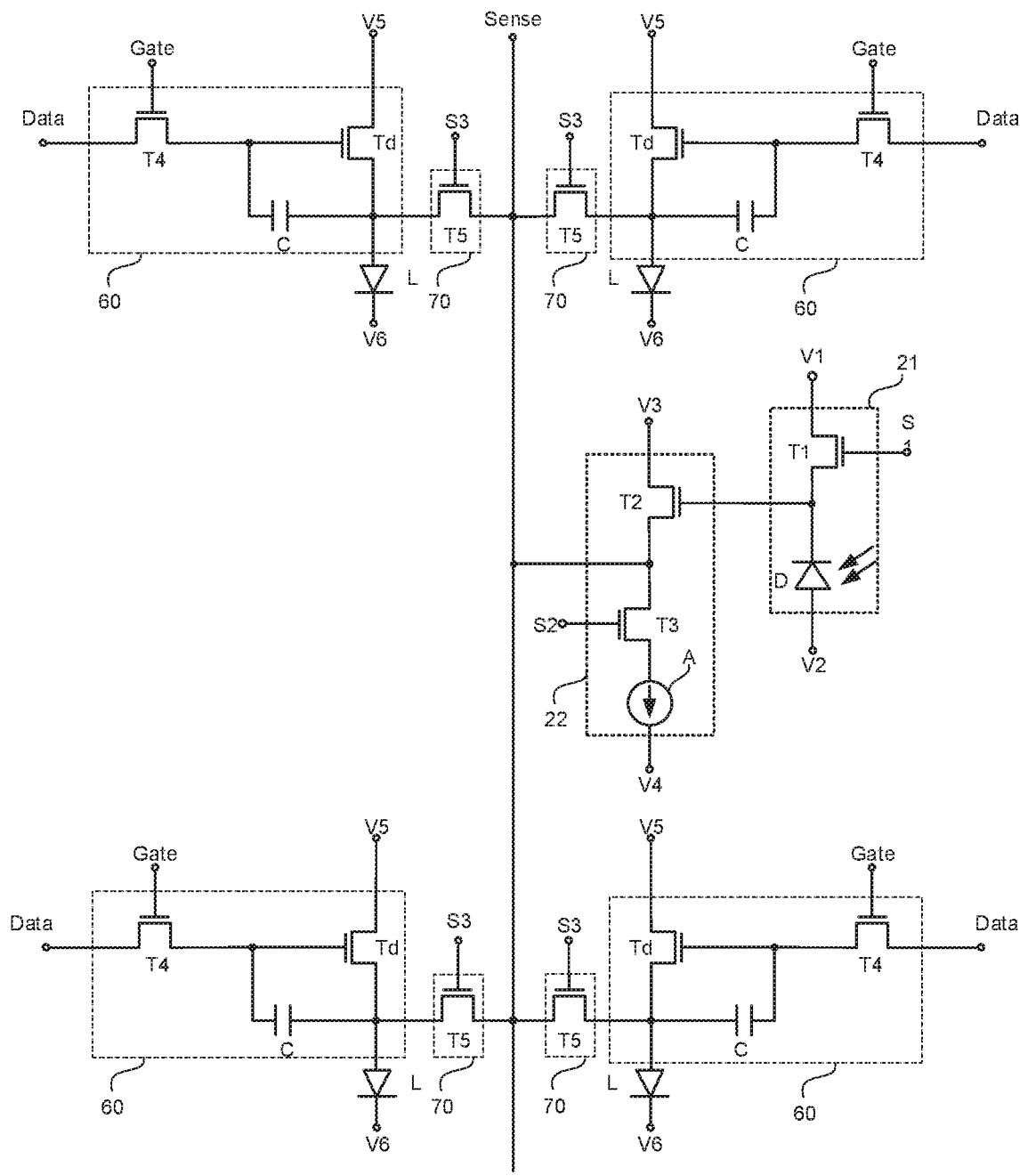
FIG. 16 is a schematic diagram showing structures of a photosensitive detection assembly and electronic detection circuits in an array substrate, according to some embodiments of the present disclosure.

It will be added that, a plurality of electronic detection circuits 70 corresponding to different sub-pixels 10 may share a same second reading signal line Sense2. Based on this, in a case where the photosensitive detection assemblies 20 corresponding to different sub-pixels 10 share the same first reading signal line Sense1, for example, as shown in FIG. 15 or FIG. 16, the second reading signal line Sense2 and the first reading signal line Sense1 may be the same reading signal line Sense.

Figure 4:
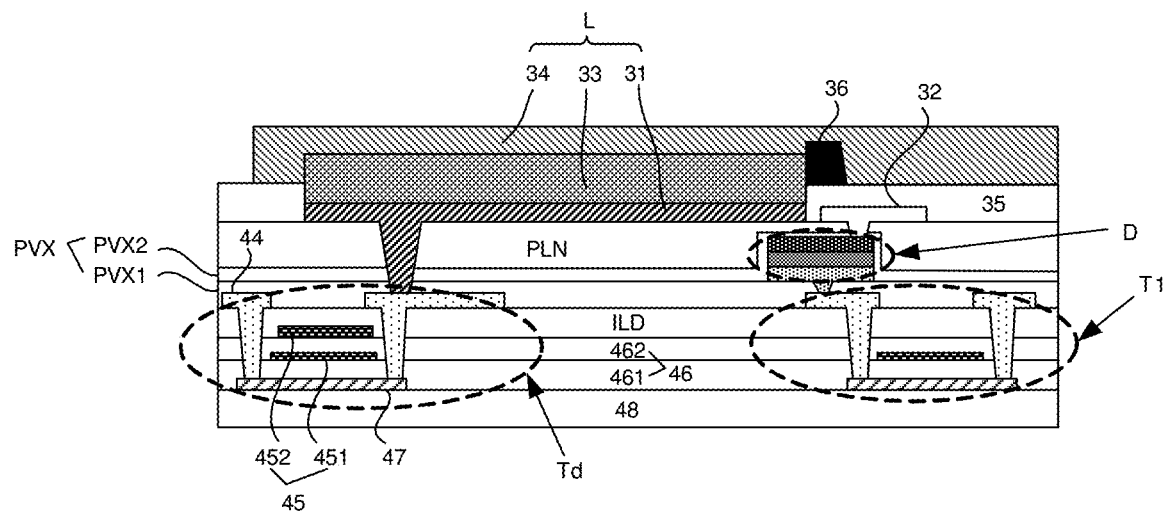
FIG. 4 is a cross-sectional diagram of a local structure of the array substrate in FIG. 3 along an OO direction.
Figure 5:
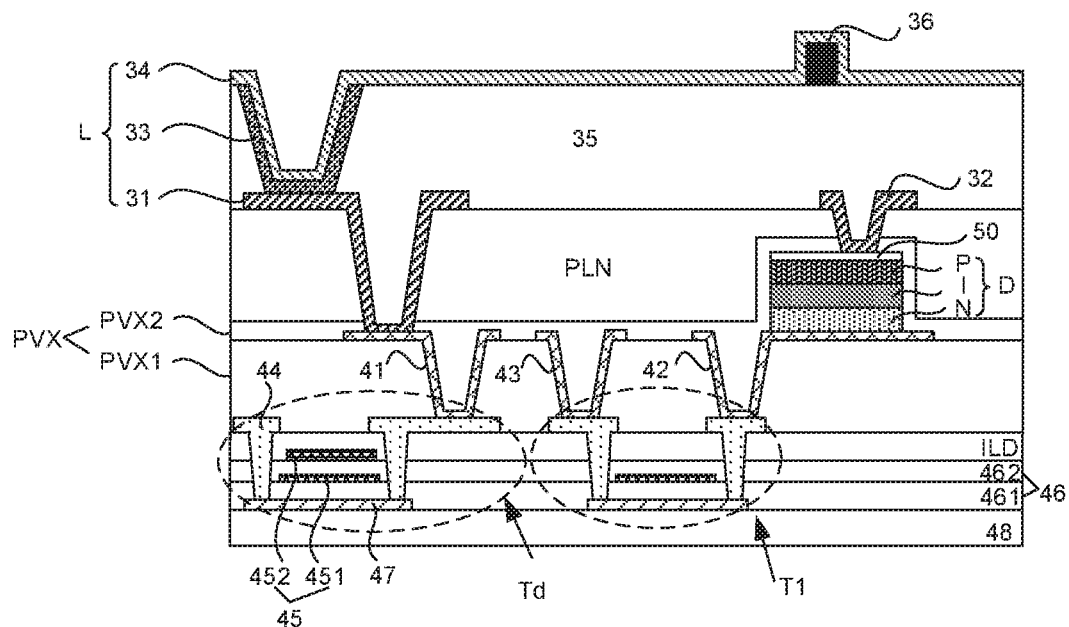
FIG. 5 is another cross-sectional diagram of a local structure of the array substrate in FIG. 3 along an OO direction.

In some embodiments, referring to FIG. 4 and FIG. 5, a first transistor T1 in each photosensitive element 21 is disposed in same layers as a driving transistor Td in a corresponding sub-pixel 10. That is, when the driving transistor Td is formed on a side of a base substrate 48 in the array substrate, the first transistor T1 in the photosensitive element 21 is synchronously formed. For example, an active layer is formed on a side of the base substrate 48, and the active layer is patterned to obtain at least an active layer 47 of the driving transistor Td and an active layer 47 of the first transistor T1. Similarly, a gate insulating layer 46, a patterned gate layer 45, an interlayer insulating layer ILD, a patterned source and drain metal layer 44, and a passivation layer PVX are sequentially formed on a surface of the active layer 47 away from the base substrate 48. After a gate layer is patterned, at least a gate of the driving transistor Td and a gate of the first transistor T1 are obtained. After a source and drain metal layer is patterned, at least the source and the drain of the driving transistor Td and the source and the drain of the first transistor T1 are obtained. The source and the drain of the driving transistor Td are electrically connected to the active layer of the driving transistor Td. The source and the drain of the first transistor T1 are electrically connected to the active layer of the first transistor T1.

Therefore, the driving transistor Td and the first transistor T1 synchronously manufactured described above are disposed in the same layers. That is, film layers of the driving transistor Td are respectively in the same layers as corresponding film layers of the first transistor T1, which may simplify a manufacturing process of the array substrate.

In some embodiments, the driving transistor Td has a single-gate structure or a dual-gate structure, and the first transistor T1 has a single-gate structure or a dual-gate structure. For example, with continued reference to FIG. 4, the driving transistor Td has a dual-gate structure, and the first transistor T1 has a single-gate structure. A first gate insulating layer 461, a patterned first gate layer 451, a second gate insulating layer 462, and a patterned second gate layer 452 are sequentially formed on the surface of the active layer 47 away from the base substrate 48. After a first gate layer is patterned, at least a first gate of the driving transistor Td and the gate of the first transistor T1 are obtained. After a second gate layer is patterned, at least a second gate of the driving transistor is obtained.

In some embodiments, with continued reference to FIG. 4, a planarization layer PLN and a pixel defining layer 35 are usually disposed on a side of the passivation layer PVX away from the base substrate 48 in sequence. Each open region of the pixel defining layer 35 is provided with a first electrode 31 and a second electrode 34 disposed opposite to each other, as well as a light-emitting layer 33 interposed between the first electrode 31 and the second electrode 34, so as to form the light-emitting device L of the corresponding sub-pixel. The first electrode 31 is electronically connected to the source or the drain of the driving transistor Td in the same sub-pixel. The light-emitting layer 33 has a single-layer structure or a multilayer structure. In addition, the array substrate further includes spacers 36 disposed on a side of the pixel defining layer 35 away from the planarization layer PLN. The spacers 36 are configured to support a cover plate disposed opposite to the array substrate where the spacers 36 are located.

In addition, with continued reference to FIG. 4, the passivation layer PVX includes a first passivation layer PVX1 and a second passivation layer PVX2 that are disposed in a stack. The photosensitive diode D in the photosensitive element 21 is disposed between the first passivation layer PVX1 and the second passivation layer PVX2. The photosensitive diode D is usually a PIN photodiode. That is, the photodiode D includes a P layer, an I layer and an N layer disposed in a stack.

Referring to FIG. 5, in some embodiments, the driving transistor Td in each sub-pixel 10 is coupled to the light-emitting device L in the same sub-pixel 10 through a first interlayer conductive layer 41. The first transistor T1 in each photosensitive element 21 is coupled to the photosensitive diode D in the same photosensitive element through a second interlayer conductive layer 42, and is coupled to the first voltage terminal V1 through a first signal line 43. Thus, in a case where a thickness of the passivation layer PVX is larger, phenomena of a deeper via hole and a deposition layer's fractures due to a direct electrical connection between the light-emitting device L and the driving transistor Td may be avoided, thereby ensuring a good electrical connection between the light-emitting device L and the driving transistor Td. Similarly, in the case where the thickness of the passivation layer PVX is larger, the second interlayer conductive layer 42 may be used to ensure a good electrical connection between the photosensitive diode D and the first transistor T1, and the first signal line 43 may be used to ensure a good electrical connection between the first voltage terminal V1 and the first transistor T1.

Optionally, the first interlayer conductive layer 41, the second interlayer conductive layer 42 and the first signal line 43 are disposed in a same layer. That is, the first interlayer conductive layer 41, the second interlayer conductive layer 42 and the first signal line 43 may be formed through a same patterning process, thereby simplifying the manufacturing process. In addition, the first interlayer conductive layer 41, the second interlayer conductive layer 42 and the first signal line 43 may be made of a same conductive material or different conductive materials.

In some embodiments, the photosensitive diode D in each photosensitive element 21 is disposed on a side of the first transistor T1 in the photosensitive element 21 proximate to the light-emitting device L of the corresponding sub-pixel 10, so that the photosensitive diode D may accurately sense the light emitted from the light-emitting device L.

In some embodiments, other thin film transistors in the array substrate, such as the second transistor T2, the third transistor T3, the fourth transistor T4 or the fifth transistor T5, are all manufactured in synchronization with the driving transistor Td. Therefore, an order of manufacturing devices in the array substrate is: firstly manufacturing thin film transistors in the array substrate, then manufacturing the photosensitive diodes D, and finally manufacturing the light-emitting devices L, etc. In the manufacturing process, only a process of manufacturing the photosensitive diodes D is added on a basis of an original process of manufacturing an OLED array substrate, and the manufacturing process is simple.

With continued reference to FIG. 5, in some embodiments, in each photosensitive element 21, a positive electrode of the photosensitive diode D is closer to the light-emitting device L in the corresponding sub-pixel 10 than a negative of the photosensitive diode. The positive electrode of the photosensitive diode D is coupled to the second voltage terminal V2 through a transparent conductive layer 50, and the transparent conductive layer 50 covers or partially covers a surface of the positive electrode of the photosensitive diode D. The voltage signal provided by the second voltage terminal V2 is transmitted to the positive electrode of the photosensitive diode D through the transparent conductive layer 50, and an area of the photosensitive diode D receiving an electrical signal may be effectively increased without affecting the photosensitive diode D sensing an optical signal, thereby achieving a stable electrical signal transmission between the second voltage terminal V2 and the photosensitive diode D.

With continued reference to FIG. 5, in some embodiments, the light-emitting device L includes a first electrode 31 and a second electrode 34 disposed opposite to each other, and a light-emitting layer 33 interposed between the first electrode 31 and the second electrode 34. The transparent conductive layer 50 is coupled to the second voltage terminal V2 through a second signal line 32. Here, the first electrode 31 of the light-emitting device L is disposed in the same layer as the second signal line 32, so as to simplify the manufacturing process of the array substrate.

In some embodiments, the first electrode 31 of the light-emitting device L includes a reflective electrode. An orthographic projection of the reflective electrode on a plane where a surface of the transparent conductive layer 50 is located does not cover or partially covers the transparent conductive layer 50, so that the light emitted from the light-emitting device L may reach the photosensitive diode D without being blocked by the reflective electrode.

For example, the first electrode 31 is made of a metal conductive material, so that the first electrode 31 is a reflective electrode. Or, a patterned electrode layer made of a metal conductive material is formed on a side of the planarization layer PLN away from the passivation layer PVX. After an electrode layer is patterned, at least the first electrode 31 of the light-emitting device and the second signal line 32 are obtained, and the first electrode 31 of the light-emitting device is a reflective electrode.

Referring to FIG. 17, some embodiments of the present disclosure provide a display apparatus 001. The display apparatus 001 includes the array substrate 01 provided by some embodiments described above and a detection integrated circuit 80 coupled to at least one first reading signal line Sense1 in the array substrate 01. The detection integrated circuit 80 is configured to receive a first detection signal transmitted by the at least one first reading signal line Sense1.

Optionally, the detection integrated circuit 80 includes at least one reading terminal 81. Each reading terminal 81 is coupled to at least one first reading signal line Sense1. Each reading terminal 81 is configured to receive a first detection signal transmitted by the at least one first reading signal line Sense1.

In some embodiments, the display apparatus 001 further includes a controller 90 coupled to the detection integrated circuit 80. The controller 90 is configured to determine an actual luminance of a sub-pixel 10 according to each first detection signal received by the detection integrated circuit 80, and control the data voltage terminal Data to provide a compensated data voltage signal to the sub-pixel 10 according to a difference between the actual luminance and a target luminance, so as to calibrate the luminance of the sub-pixel 10.

Optionally, the controller includes a main control microcontroller unit (MCU), a central processing unit (CPU), a single chip microcomputer, or a programmable logic gate circuit.

In some embodiments of the present disclosure, after the photosensitive detection assembly 20 acquires the luminance of a sub-pixel 10, a first reading signal line Sense1 coupled to the photosensitive detection assembly 20 may transmits a first detection signal output by the photosensitive detection assembly 20 to the detection integrated circuit 80, and the detection integrated circuit 80 transmits the first detection signal to the controller 90. Thereby a calibration of the luminance of the at least one corresponding sub-pixel 10 is completed by the controller 90.

In some embodiments, the array substrate 01 is provided with at least one electronic detection circuit 70. The detection integrated circuit 80 is further coupled to at least one second reading signal line Sense2 in the array substrate 01, and the detection integrated circuit 80 is further configured to receive a second detection signal transmitted by the at least one second reading signal line Sense2. The second detection signal is a detection signal output by the electronic detection circuit 70 in the array substrate 01 to the second reading signal line Sense2. The controller 90 is further configured to, according to each second detection signal received by the detection integrated circuit 80, determine an actual light-emitting driving current of a corresponding sub-pixel 10, and control the data voltage terminal Data to provide the compensated data voltage signal to the corresponding sub-pixel 10 according to a difference between the actual light-emitting driving current and a corresponding target light-emitting driving current, so as to calibrate the luminance of the corresponding sub-pixel 10.

Optionally, each reading terminal 81 of the detection integrated circuit 80 is further coupled to at least one second reading signal line Sense2. Each reading terminal 81 is configured to receive a second detection signal transmitted by the corresponding second reading signal line Sense2.

In some embodiments of the present disclosure, after each electronic detection circuit 70 outputs a second detection signal of the corresponding sub-pixel 10, the second detection signal output by each electronic detection circuit 70 may be transmitted to the detection integrated circuit 80 through the second reading signal line Sense2 correspondingly coupled to each electronic detection circuit 70, and is fed back to the controller 90 through the detection integrated circuit 80. Thereby a calibration of the luminance of the corresponding sub-pixel 10 is completed.

It will be added that, the detection integrated circuit 80, as a signal relay station between the controller 90 and the first reading signal line Sense1, or between the controller 90 and the second reading signal line Sense2, may convert an analog signal transmitted by the first reading signal line Sense1 or the second reading signal line Sense2 to a digital signal, and transmit the converted digital signal to the controller 90. Thereby it is facilitating for the controller 90 to process the digital signal. In addition, each reading terminal 81 of the detection integrated circuit 80 refers to a node, a port or the like where the detection integrated circuit 80 is coupled to the corresponding first reading signal line Sense1 or the corresponding second reading signal line Sense2.

The display apparatus 001 provided by some embodiments of the present disclosure includes the array substrate 01 in any embodiment of the above embodiments, and beneficial effects of the display apparatus 001 are the same as those of the array substrate 01, and details are not described herein again. In addition, in some embodiments, the display apparatus 001 includes the OLED display apparatus, which is, for example, any product or component having a display function, such as a mobile phone, a tablet computer, a television, a display, a notebook computer, a digital frame, or a navigator.

Some embodiments of the present disclosure provide a luminance calibration method that is applied to the display apparatus 001 provided by some embodiments described above. The luminance calibration method includes a luminance detection period and a luminance calibration period. Referring to FIG. 18, the luminance calibration method includes S11 and S12. The luminance detection period includes a photosensitive detection period, and the luminance calibration period includes a photosensitive calibration period.

In S11, in the photosensitive detection period, a photosensitive element 21 of a photosensitive detection assembly 20 in the array substrate 01 detects a luminance of a corresponding sub-pixel 10, and outputs a light detection signal to a signal reading element 22 according to the luminance of the corresponding sub-pixel 10; the signal reading element 22 reads the light detection signal, and outputs a first detection signal to a first reading signal line Sense1 according to the light detection signal; and the first reading signal line Sense1 transmits the first detection signal to the detection integrated circuit 80.

In S12, in the photosensitive calibration period, the luminance of the corresponding sub-pixel 10 is calibrated according to the first detection signal transmitted by the detection integrated circuit 80.

It will be understood that, in a case where different photosensitive detection assemblies 20 are coupled to a same first reading signal line Sense1, sub-pixels 10 corresponding to the different photosensitive detection assemblies 20 coupled to the same first reading signal line Sense1 are driven in different time periods. That is to say, the sub-pixel 10 corresponding to the same first reading signal line Sense1 are light up in different time periods respectively. Thus, in a case where the luminance of each sub-pixel 10 is detected and calibrated in its illuminated period, different detection signals corresponding to the sub-pixels may be distinguished from each other.

In some embodiments, the photosensitive detection assembly 20 includes a photosensitive element 21 and a signal reading element 22. The photosensitive element 21 includes a photosensitive diode D and a first transistor T1. The photosensitive detection period includes a voltage reset period t1 and a charge integration period t2.

The process in which the photosensitive element 21 detects the luminance of the corresponding sub-pixel 10, and outputs the light detection signal to the signal reading element 22 according to the luminance of the corresponding sub-pixel 10 in step S11, includes the following processes.

In the voltage reset period t1 the first transistor T1 in the photosensitive element 21 is turned on under the control of the first control terminal S1, and the photosensitive diode D in the photosensitive element 21 is reverse biased under the actions of voltage signals provided by the first voltage terminal V1 and the second voltage terminal V2, so that the photosensitive diode D is in the working state and detects the luminance of the corresponding sub-pixel.

In the charge integration period t2, the first transistor T1 is turned off under the control of the first control terminal S1. After receiving the illumination of the corresponding sub-pixel 10, the photosensitive diode D outputs the voltage signal from a negative electrode to the signal reading element 22 as a light detection voltage signal.

In some embodiments, the photosensitive detection period further includes a signal reading period t3. The process in which the signal reading element 22 reads the light detection signal, and outputs the first detection signal to the first reading signal line Sense1 according to the light detection signal in the S11, includes the following processes.

In the signal reading period t3, the signal reading element 22 reads the light detection signal under control of the second control terminal S2, and outputs the a voltage following signal in phase with the light detection signal as the first detection signal to the first reading signal line Sense1.

The above process of detecting and calibrating the luminance of the sub-pixel 10 in the display apparatus 001 by using the photosensitive detection assembly 20 is a photosensitive luminance calibration mode.

It will be noted that, before luminances of sub-pixels in the display apparatus 001 is calibrated, reference parameters of each sub-pixel in a corresponding detection gray scale (a gray scale when the luminance of the sub-pixel is detected) have been pre-stored in the display apparatus 001 (for example, stored in the controller 90 of the display apparatus 001), and the reference parameter includes a reference voltage $V_i$ and a target voltage difference $\Delta V_u$.

Any sub-pixel 10 to be detected and calibrated in the display apparatus 001 is used as a target sub-pixel, and processes of obtaining a reference voltage $V_i$ and a target voltage difference $\Delta V_u$ corresponding to the target sub-pixel are as follows.

The process of obtaining the reference voltage $V_i$ corresponding to the target sub-pixel includes: in a case where a luminance of the target sub-pixel is the target luminance, the first voltage terminal V1 providing a high level reset voltage, the third voltage terminal V3 providing a high level voltage, and the second voltage terminal V2 and the fourth voltage terminal V4 each providing a low level voltage; the first transistor T1 in the photosensitive detection assembly 20 being turned on under the control of the first control terminal S1; the second transistor T2 in the signal reading element 22 being turned on under the control of a voltage signal output from the photosensitive element 21 in each photosensitive detection assembly 20; the third transistor T3 being turned on under the control of the second control terminal S2; and the signal reading element 22 outputting a voltage to the first reading signal line Sense1 as the reference voltage $V_i$ corresponding to the target sub-pixel.

After the reference voltage $V_i$ corresponding to the target sub-pixel is obtained, the first transistor T1 is turned off under the control of the first control terminal S1. The first voltage terminal V1 provides a low level voltage. The third transistor T3 is turned off under the control of the second control terminal S2. Voltages provided by other voltage terminals remain unchanged. In this case, the voltage on the negative electrode of the photosensitive diode D continues droping. After a dropping duration of the voltage on the negative electrode of the photosensitive diode D reaches a preset charge integration time t, the third transistor T3 is turned on under the controlled of the second control terminal S2. A difference between a voltage $V_u$ output from the signal reading element 22 to the first reading signal line Sense1 and the above reference voltage $V_i$ is the target voltage difference $\Delta V_u$.

Here, the preset charge integration time t of each sub-pixel may be preset according to a detection gray scale corresponding to the sub-pixel. It will be understood that, when the luminance of the sub-pixel 10 is detected and calibrated, since the detection gray scale and a displayed color corresponding to each sub-pixel 10 are not completely the same, the preset charge integration time t corresponding to the sub-pixel 10 is not completely the same and may be set according to actual needs.

In addition, a setting of the preset charge integration time t of each sub-pixel needs to satisfy the following condition: after the dropping duration of the voltage on the negative electrode of the photosensitive diode D reaches the preset charge integration time t, the voltage on the negative electrode of the photosensitive diode D may still control the second Transistor T2 to be turned on. For example, during the process of obtaining the reference voltage $V_i$ corresponding to the target sub-pixel, the high level reset voltage provided by the first voltage terminal V1 is 10V, and the voltage provided by the second voltage terminal V2 is −6V. During the process of obtaining the target voltage difference $\Delta V_u$ corresponding to the target sub-pixel, a detection gray scale corresponding to the target sub-pixel is 10, and a preset charge integration time t corresponding to the target sub-pixel is set to 10 ms. Thus, after the preset charge integration time of 10 ms, the voltage on the negative electrode of the photosensitive diode D will drop from 10V to 7V, and a dropped voltage of 7V is sufficient to control the second transistor T2 to be turned on.

Based on this, in a process of calibrating the luminance of the target sub-pixel by using the photosensitive luminance calibration mode, optionally, a timing diagram of controlling the target sub-pixel is as shown in FIG. 19, and a luminance calibration method corresponding to the target sub-pixel is as follows.

Referring to FIG. 2 and FIG. 18, the fifth voltage terminal V5 provides a high level voltage, and the sixth voltage terminal V6 provides a low level voltage. The pixel driving circuit 60 drives the light-emitting device L in the target sub-pixel to light up under the control of the scanning signal and the data voltage signal, so as to illuminate the target sub-pixel.

The second voltage terminal V2 and the fourth voltage terminal V4 continuously provide the low level voltage, and the third voltage terminal V3 continuously provides the high level voltage.

In the voltage reset period t1, the first voltage terminal V1 provides the high level reset voltage, and the first control terminal S1 provides a high level signal. The first transistor T1 in the photosensitive element 21 is turned on under the control of the first control terminal S1 to transmit the high level reset voltage provided by the first voltage terminal V1 is to the negative electrode of the photosensitive diode D. It will be noted here that, the high level reset voltage provided by the first voltage terminal V1 is higher than the low level voltage provided by the second voltage terminal V2, so that the photosensitive diode D may be reverse biased under the actions of the voltage signals provided by the first voltage terminal V1 and the second voltage terminal V2, so that the photosensitive diode D is in the working state and may detect the luminance of the target sub-pixel.

In the charge integration period t2, the first control terminal S1 provides a low level signal to control the first transistor T1 to be turned off, and the first voltage terminal V1 provides the low level voltage. The photosensitive diode D is still reverse biased, and generates a photocurrent after receiving illumination of the target sub-pixel, which causes the voltage on the negative electrode of the photosensitive diode D to drop. After the dropping duration of the voltage on the negative electrode of the photosensitive diode D reaches the preset charge integration time t, the voltage signal from the negative electrode of the photosensitive diode D is output as a light detection signal to the signal reading element 22.

In the signal reading period t3, that is, after the dropping duration of the voltage negative electrode of the photosensitive diode D reaches the preset charge integration time t, the second control terminal S2 provides a high level signal to control the second transistor T2 to be turned on. The signal reading element 22 outputs the first detection signal in phase with the light detection signal to the detection integrated circuit 80 through the first read signal line Sense1. The controller 90 may obtain an actual difference $\Delta V$ between the first detection signal and the reference voltage $V_i$ according to the first detection signal transmitted by the detection integrated circuit 80, and obtain a difference between an actual luminance of the target sub-pixel and the target luminance as a luminance compensation amount required by the target sub-pixel according to a difference between the actual difference $\Delta V$ and a target difference $\Delta_u$, so as to calibrate the luminance of the target sub-pixel according to the luminance compensation amount. For example, the controller 90 controls the data voltage terminal Data to provide the compensated data voltage signal to the target sub-pixel according to the luminance compensation amount obtained, which may effectively compensate the threshold voltage drift and the electron mobility fluctuation of the driving transistor Td in the target sub-pixel, so that an actual luminance of the light-emitting device L in the target sub-pixel is consistent with the target luminance, thereby achieving a calibration of the luminance of the target sub-pixel, and ensuring that the display apparatus 001 has a good display effect.

In a case where a photosensitive detection assembly 20 corresponds to multiple sub-pixels, the luminance of the target sub-pixel and luminances of other sub-pixels corresponding to a same photosensitive detection assembly 20 are detected and calibrated in different time periods. That is, after the luminance of the target sub-pixel is detected and calibrated, the luminances of other sub-pixels 10 corresponding to the same photosensitive detection assembly 20 may be detected and calibrated one by one by using the above method.

Of course, referring to FIG. 8, in a case where the array substrate 01 includes sub-pixel groups 100, and each sub-pixel group 100 includes four sub-pixels 10, if the photosensitive detection assembly 20 corresponding to each sub-pixel group 100 is respectively coupled to a different first reading signal lines Sense1, in the process of detecting and calibrating the luminance of each sub-pixel in the array substrate 01, sub-pixels 10 at a same position (e.g., an upper left corner) in the sub-pixel groups 100 may be driven to simultaneously emit light, and the luminances are correspondingly detected and calibrated.

In some embodiments, the display apparatus 001 is provided with the electronic detection circuit 70, and the luminances of the sub-pixels in the display apparatus 001 may also be detected and calibrated by using an electronic luminance calibration mode.

Referring to FIG. 20, in the electronic luminance calibration mode, the luminance detection period further includes an electronic detection period, and the luminance calibration period further includes an electronic calibration period.

In S12, in the electronic detection period, the electronic detection circuit 70 in the array substrate 01 detects the light-emitting driving current of the corresponding sub-pixel 10 under the control of the third control terminal S3, and outputs a second detection signal to the second reading signal line Sense2 according to the light-emitting driving current; and the second reading signal line Sense2 transmits the second detection signal to the detection integrated circuit 80.

In S22, in the electronic calibration period, the luminance of the corresponding sub-pixel 10 is calibrated according to the second detection signal transmitted by the detection integrated circuit 80.

Optionally, any sub-pixel 10 to be detected and calibrated in the display apparatus 001 is used as the target sub-pixel, and a second reading signal line Sense2 coupled to an electronic detection circuit 70 corresponding to the target sub-pixel and a first read signaling line Sense1 coupled to a photosensitive detection assembly 20 corresponding to the target sub-pixel are different reading signal lines. Here, the electronic luminance calibration mode and the photosensitive luminance calibration mode may be alternatively used, or used in a same time period, or respectively used in different time periods. As for an implementation of the photosensitive luminance calibration mode, please refer to some embodiments described above, and the following is only a description of the implementation of the electronic luminance calibration mode.

Referring to FIG. 13, in a process of detecting and calibrating the luminance of the target sub-pixels by using the electronic luminance calibration mode, the fifth voltage terminal V5 provides a high level voltage, the sixth voltage terminal V6 provides a low level voltage, and the pixel driving circuit 60 drives the light-emitting device L in the target sub-pixel to emit light under the control of the scanning signal and the data voltage signal. The third control terminal S3 provides a high level signal to control the fifth transistor T5 to be turned on. The light-emitting driving current output by the pixel driving circuit 60 to the light-emitting device L is output as a second detection signal to the second reading signal line Sense2.

After the second reading signal line Sense2 transmits the second detection signal to the detection integrated circuit 80, the controller 90 may obtain an actual light-emitting driving current of the target sub-pixel according to the second detection signal transmitted by the detection integrated circuit 80, and control the data voltage terminal Data to provide a compensated data voltage signal to the target sub-pixel according to a difference between the actual light-emitting driving current and a target light-emitting driving current, so that the actual light-emitting driving current of the target sub-pixel is consistent with the target light-emitting driving current, thereby achieving the calibration of the luminance of the target sub-pixel to ensure that the display apparatus 001 has a good display effect.

Optionally, any sub-pixel 10 in the display apparatus 001 to be detected and calibrated is used as the target sub-pixel, and the second reading signal line Sense2 coupled to the electronic detection circuit 70 corresponding to the target sub-pixel and the first reading signal line Sense1 coupled to the photosensitive detection assembly 20 corresponding to the target sub-pixel are a same reading signal line. Here, the electronic luminance calibration mode and the photosensitive luminance calibration mode may be alternatively used in a same time period or separately used in different time periods.

Referring to FIG. 14, in a case where the electronic luminance calibration mode and the photosensitive luminance calibration mode are alternatively used, if the photosensitive luminance calibration mode is selected, the third control terminal S3 provides a low level signal to control the fifth transistor T5 to be turned off. That is, the electronic detection circuit 70 is controlled to be turned off, and is in a non-detection state. As for an implementation of the photosensitive luminance calibration mode, please refer to some embodiments described above, and details are not described herein again.

Figure 21:
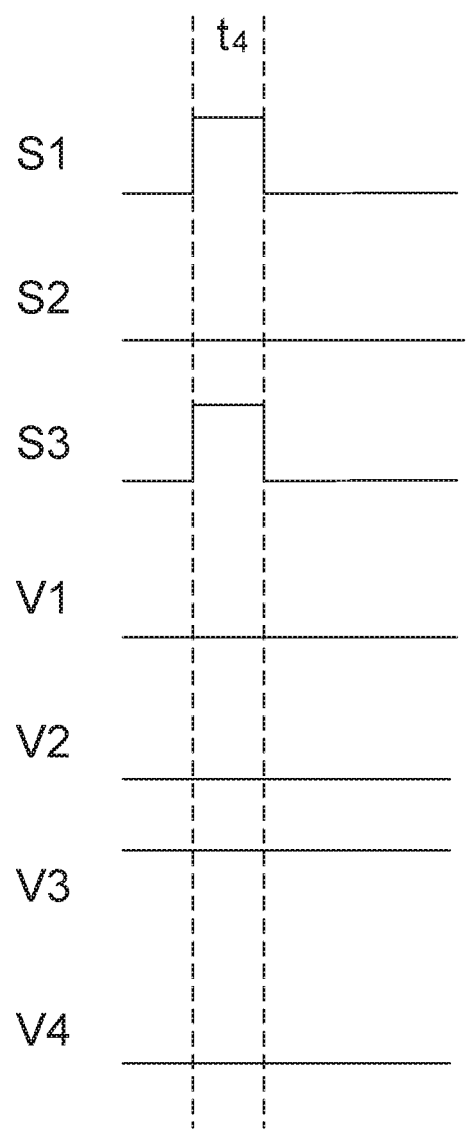
FIG. 21 is another timing diagram of a luminance calibration method of a display apparatus, according to some embodiments of the present disclosure.

If the electronic luminance calibration mode is selected, referring to FIG. 21, in a period t4, the first control terminal S1 provides the high level signal to control the first transistor T1 to be turned on, and the low level voltage provided by the first voltage terminal V1 is output to the control electrode of the second transistor T2 to control the second transistor T2 to be turned off. The second control terminal S2 provides a low level signal to control the third transistor T3 to be turned off. The photosensitive detection assembly 20 is in a non-detection state, and an implementation of the electronic luminance calibration mode is as described below.

The third control terminal S3 provides a high level signal to control the fifth transistor T5 to be turned on. The light-emitting driving current output by the pixel driving circuit 60 to the light-emitting device L is output as a second detection signal to the reading signal line Sense; and the electronic detection circuit 70 is in a detection state. After the reading signal line Sense transmits the second detection signal to the detection integrated circuit 80, the controller 90 may obtain the actual light-emitting driving current of the target sub-pixel according to the second detection signal transmitted by the detection integrated circuit 80, and control the data voltage terminal Data to provide a compensated data voltage signal to the target sub-pixel according to a difference between the actual light-emitting driving current and the target light-emitting driving current, so that the actual light-emitting driving current of the target sub-pixel is consistent with the target light-emitting driving current, thereby achieving the calibration of the luminance of the target sub-pixel to ensure that the display apparatus 001 has a good display effect.

With continued reference to FIG. 14, in a case where the electronic luminance calibration mode and the photosensitive luminance calibration mode are separately used in different time periods, the electronic luminance calibration mode may be firstly used to detect and calibrate the luminance of the target sub-pixel for the first time, and then the photosensitive luminance calibration mode is used to detect and calibrate the luminance of the target sub-pixel for the second time, which may increase an accuracy of detecting the luminance of the target sub-pixel and improve an accuracy of calibrating the luminance of the target sub-pixel. Of course, it is also permissible that the photosensitive luminance calibration mode is firstly used to detect and calibrate the luminance of the target sub-pixel for the first time, and then the electronic luminance calibration mode is used to detect and calibrate the luminance of the target sub-pixel for the second time. As for the implementations of the electronic luminance calibration mode and the photosensitive luminance calibration mode, please refer to some embodiments described above, and details are not described herein again.

It will be noted that, some embodiments of the present disclosure are described by taking an example in which the third voltage terminal V3 and the fifth voltage terminal V5 each provide a high level voltage VDD, the second voltage terminal V2, the fourth voltage terminal V4, and the sixth voltage terminal V6 each provide a low level voltage VSS, and the fourth voltage terminal V4 and the sixth voltage terminal V6 may also be grounded. Here, the high level and the low level only indicate a relative magnitude relationship between their corresponding voltages.

In some embodiments, sub-pixels corresponding to different electronic detection circuits 70 coupled to a same second reading signal line Sense2 are driven in different time periods. That is, the respective sub-pixels corresponding to different electronic detection circuits 70 coupled to the same second reading signal line Sense2 are driven to emit light in different time periods, so as to read the second detection signals corresponding to the sub-pixels one by one by using a single second reading signal line Sense2, thereby achieving an independent detection output of the luminance of each sub-pixel.

In some embodiments, referring to FIG. 18, in a case where the luminances of the sub-pixels 10 in the display apparatus 001 are detected and calibrated by using the photosensitive luminance calibration mode alone, a luminance calibration cycle includes a photosensitive detection period and a photosensitive calibration period.

Referring to FIG. 20, in a case where the luminances of the sub-pixels 10 in the display apparatus 001 are detected and calibrated by using the electronic luminance calibration mode alone, a luminance calibration cycle includes an electronic detection period and an electronic calibration period.

For example, the display apparatus 001 is provided with both the electronic detection circuit 70 and the photosensitive detection assembly 20, and the controller 90 in the display apparatus 001 can select any one of the electronic luminance calibration mode and the photosensitive luminance calibration mode, so that the luminances of the sub-pixels in the display apparatus 001 are detected and calibrated by using the electronic luminance calibration mode alone or the photosensitive luminance calibration mode alone. Thus, in a case where the controller 90 selects to use the electronic luminance calibration mode to detect and calibrate the luminances of the sub-pixels in the display apparatus 001, a luminance calibration cycle of each sub-pixel 10 includes an electronic detection period and an electronic calibration period. In a case where the controller 90 selects to use the photosensitive luminance calibration mode to detect and calibrate the luminances of the sub-pixels in the display apparatus 001, a luminance calibration cycle of each sub-pixel 10 includes a photosensitive detection period and a photosensitive calibration period.

Figure 22:
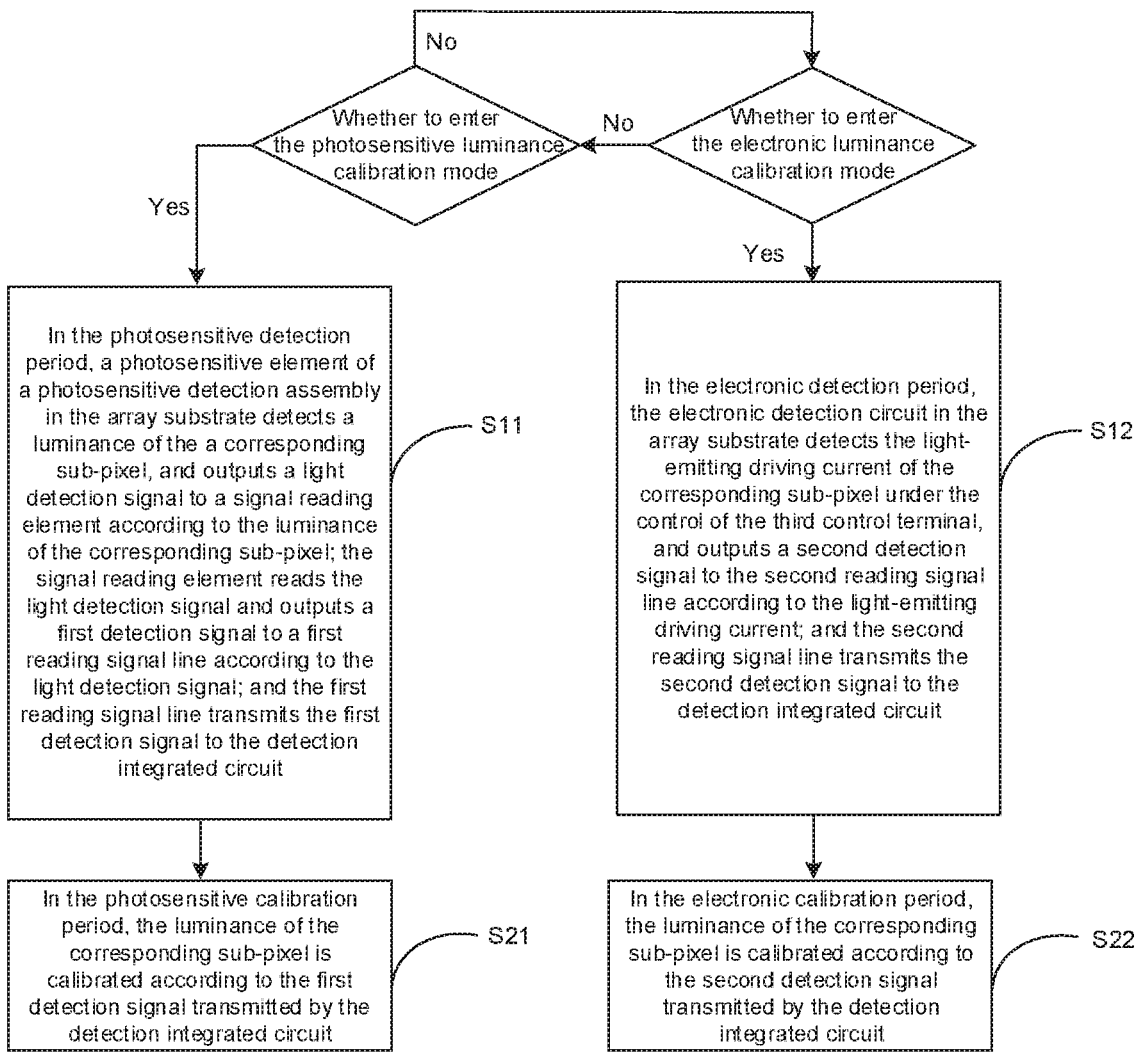
FIG. 22 is yet another flow diagram of a luminance calibration method of a display apparatus, according to some embodiments of the present disclosure.

In some embodiments, referring to FIG. 22, in a case where the luminances of the sub-pixels 10 in the display apparatus 001 are detected and calibrated twice by using the photosensitive luminance calibration mode and the electronic luminance calibration mode respectively, a luminance calibration cycle includes an electronic detection period, an electronic calibration period, a photosensitive detection period, and a photosensitive calibration period. The electronic detection period and the photosensitive detection period are in different time periods of the luminance calibration cycle, and the electronic calibration period and the photosensitive calibration period are in different time periods of the luminance calibration cycle.

Figure 23:
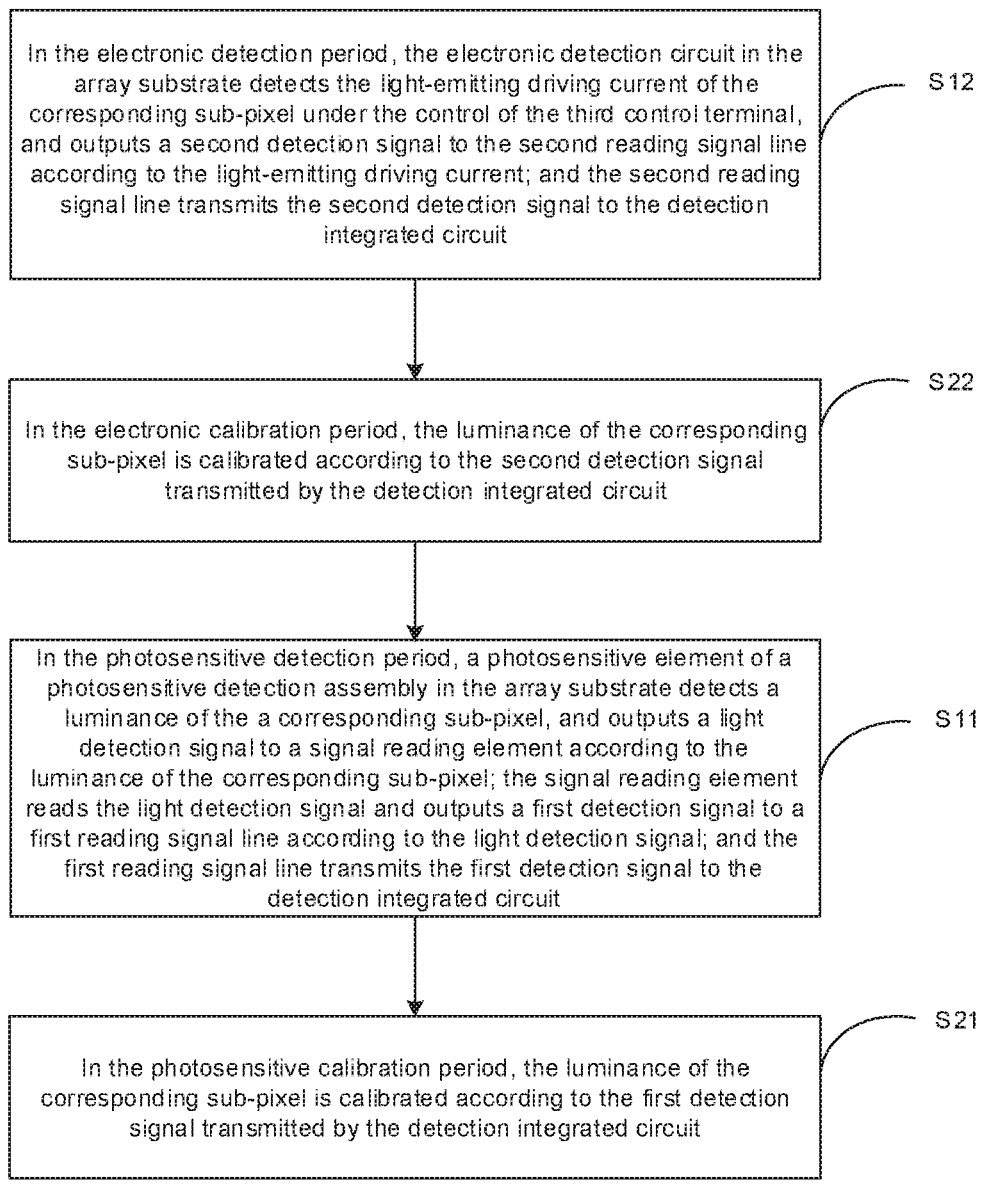
FIG. 23 is yet another flow diagram of a luminance calibration method of a display apparatus, according to some embodiments of the present disclosure.
Figure 24:
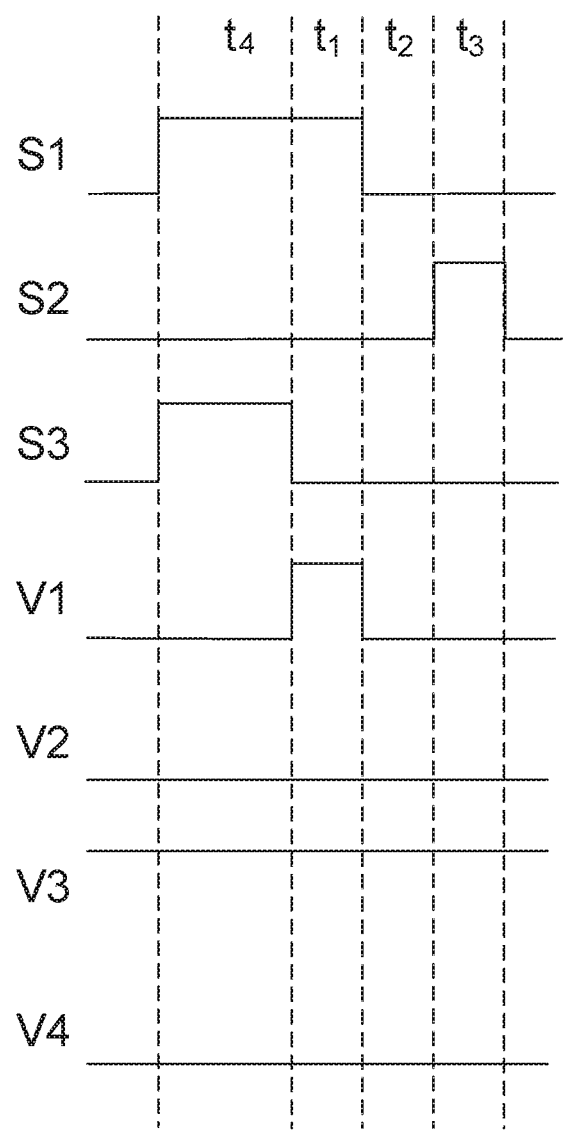
FIG. 24 is yet another timing diagram of a luminance calibration method of a display apparatus, according to some embodiments of the present disclosure.

For example, referring to FIG. 23 and FIG. 24, the electronic luminance calibration mode is firstly used to detect and calibrate the luminances of the sub-pixels in the display apparatus 001 for a first time, and then the photosensitive luminance calibration mode is used to detect and calibrate the luminances of the sub-pixels in the display apparatus 001 for a second time. Thus, a luminance calibration cycle of each sub-pixel 10 includes an electronic detection period, an electronic calibration period, a photosensitive detection period, and a photosensitive calibration period, which are sequentially set.

For example, the photosensitive luminance calibration mode is firstly used to detect and calibrate the luminances of the sub-pixels in the display apparatus 001 for a first time, and then the electronic luminance calibration mode is used to detect and calibrate the luminances of the sub-pixels in the display apparatus 001 for a second time. Thus, a luminance calibration cycle of each sub-pixel 10 includes a photosensitive detection period, a photosensitive calibration period, an electronic detection period, and an electronic calibration period, which are sequentially set. In some embodiments of the present disclosure, the luminances of the sub-pixels in the display apparatus 001 are detected and calibrated twice, which may increase the accuracy of detecting the luminance of each sub-pixel and improve the accuracy of calibrating the luminance of each sub-pixel.

In addition, it will be understood that, in some embodiments, the photosensitive detection period is at a same time period as the electronic calibration period, or a time period in which the photosensitive detection period is partially overlaps with a time period in which the electronic calibration period is. The electronic detection period is at a same time period as the photosensitive calibration period, or a time period in which the electronic detection period is partially overlaps with a time period in which the photosensitive calibration period is, which is also allowed.

In the description of the above embodiments, specific features, structures, materials or characteristics may be combined in any suitable manner in any one or more embodiments or examples.

The foregoing descriptions are merely some specific implementation manners of the present disclosure, but the protection scope of the present disclosure is not limited thereto. Any person skilled in the art could readily conceive of changes or replacements within the technical scope of the present disclosure, which shall all be included in the protection scope of the present disclosure. Therefore, the protection scope of the present disclosure shall be subject to the protection scope of the claims.

What is claimed is:

1. An array substrate, comprising:
    a plurality of sub-pixels; and
    at least one photosensitive detection assembly, each photosensitive detection assembly of the at least one photosensitive detection assembly corresponding to at least one sub-pixel, wherein
    the at least one photosensitive detection assembly includes:
    a photosensitive element configured to detect a luminance of a corresponding sub-pixel and output a light detection signal according to the luminance of the corresponding sub-pixel; and
    a signal reading element coupled to the photosensitive element and a first reading signal line, wherein the signal reading element is configured to read the light detection signal, and output a first detection signal to the first reading signal line according to the light detection signal.

2. The array substrate according to claim 1, wherein the photosensitive element includes a first transistor and a photosensitive diode, wherein
    a control electrode of the first transistor is coupled to a first control terminal, a first electrode of the first transistor is coupled to a first voltage terminal, and a second electrode of the first transistor is coupled to a negative electrode of the photosensitive diode; and
    a positive electrode of the photosensitive diode is coupled to a second voltage terminal, and the negative electrode of the photosensitive diode is further coupled to the signal reading element.

3. The array substrate according to claim 2, wherein each sub-pixel of the plurality of sub-pixels includes:
    a pixel driving circuit, wherein the pixel driving circuit is coupled to a scanning signal terminal and a data voltage terminal; and
    a light-emitting device coupled to the pixel driving circuit, wherein
    the pixel driving circuit is configured to drive the light-emitting device to emit light under control of a scanning signal provided by the scanning signal terminal and a data voltage signal provided by the data voltage terminal.

4. The array substrate according to claim 3, wherein the photosensitive diode in the photosensitive element is disposed on a side of the first transistor in the photosensitive element proximate to a light-emitting device of the at least one corresponding sub-pixel.

5. The array substrate according to claim 4, wherein in each photosensitive element,
    a positive electrode of the photosensitive diode is closer to a light-emitting device in a corresponding sub-pixel than a negative of the photosensitive diode; and
    the positive electrode of the photosensitive diode is coupled to the second voltage terminal through a transparent conductive layer, and the transparent conductive layer covers or partially covers a surface of the positive electrode of the photosensitive diode.

6. The array substrate according to claim 5, wherein the light-emitting device includes a first electrode and a second electrode disposed opposite to each other, and a light-emitting layer interposed between the first electrode and the second electrode, wherein
    the transparent conductive layer is coupled to the second voltage terminal through a second signal line, and the first electrode of the light-emitting device is disposed in a same layer as the second signal line.

7. The array substrate according to claim 6, wherein
    the first electrode of the light-emitting device includes a reflective electrode; and
    an orthographic projection of the reflective electrode on a plane where a surface of the transparent conductive layer is located does not cover or partially covers a corresponding transparent conductive layer.

8. The array substrate according to claim 3, further comprising at least one electronic detection circuit, each electronic detection circuit corresponding to a sub-pixel, wherein
    the electronic detection circuit is coupled to a third control terminal, a second reading signal line, and a pixel driving circuit in the sub-pixel, and the electronic detection circuit is configured to detect a light-emitting driving current output from the pixel driving circuit, and output a second detection signal to the second reading signal line according to the light-emitting driving current under control of the third control terminal.

9. The array substrate according to claim 8, wherein the electronic detection circuit includes a fifth transistor;
a control electrode of the fifth transistor is coupled to the third control terminal, a first electrode of the fifth transistor is coupled to the pixel driving circuit of the sub-pixel, and a second electrode of the fifth transistor is coupled to the second reading signal line.

10. The array substrate according to claim 8, wherein for an electronic detection circuit and a photosensitive detection assembly corresponding to a same sub-pixel, a second reading signal line coupled to the electronic detection circuit and a first reading signal line coupled to the photosensitive detection assembly are a same reading signal line, wherein
the electronic detection circuit and the photosensitive detection assembly corresponding to the same sub-pixel are further configured such that one of the electronic detection circuit and the photosensitive detection assembly corresponding to the same sub-pixel is selected to detect a light-emitting state of the sub-pixel and output a corresponding detection signal to the same reading signal line in a light-emitting period of the sub-pixel; or
the electronic detection circuit and the photosensitive detection assembly corresponding to the same sub-pixel are further configured to separately detect the light-emitting state of the sub-pixel and output the corresponding detection signals to the reading signal line during different time periods of the light-emitting period of the sub-pixel.

11. The array substrate according to claim 8, wherein the pixel driving circuit includes a fourth transistor, a driving transistor and a storage capacitor, wherein
a control electrode of the fourth transistor is coupled to the scanning signal terminal, a first electrode of the fourth transistor is coupled to the data voltage terminal, and a second electrode of the fourth transistor is coupled to a control electrode of the driving transistor and a first electrode of the storage capacitor; and
a first electrode of the driving transistor is coupled to a fifth voltage terminal, and a second electrode of the driving transistor is coupled to the light-emitting device and a second electrode of the storage capacitor;
the first transistor in the photosensitive element is disposed in a same layer as a driving transistor in a corresponding sub-pixel;
the driving transistor in each sub-pixel is coupled to the light-emitting device in a same sub-pixel through a first interlayer conductive layer;
the first transistor in each photosensitive element is coupled to a photosensitive diode in the same photosensitive element through a second interlayer conductive layer, and is coupled to the first voltage terminal through a first signal line, wherein
the first interlayer conductive layer, the second interlayer conductive layer, and the first signal line are disposed in a same layer.

12. A display apparatus, comprising:
the array substrate according to claim 1; and
a detection integrated circuit coupled to at least one first reading signal line in the array substrate, the detection integrated circuit being configured to receive a first detection signal transmitted by the at least one first reading signal line.

13. A luminance calibration method applied to the display apparatus according to claim 12, the method comprising:
a luminance detection period including a photosensitive detection period; and in the photosensitive detection period, detecting, by a photosensitive element of each photosensitive detection assembly in the array substrate, a luminance of a corresponding sub-pixel, and outputting, by the photosensitive element, a light detection signal to a signal reading element according to the luminance of the corresponding sub-pixel; reading, by the signal reading element, a light detection signal, and outputting, by the signal reading element, a first detection signal to a first reading signal line according to the light detection signal; and transmitting, by the first reading signal line, the first detection signal to a detection integrated circuit; and
a luminance calibration period including a photosensitive calibration period; and in the photosensitive calibration period, calibrating the luminance of the corresponding sub-pixel according to the first detection signal transmitted by the detection integrated circuit.

14. The luminance calibration method of the display apparatus according to claim 13, wherein sub-pixels corresponding to different photosensitive detection assemblies coupled to a same first reading signal line are driven in different time periods.

15. The luminance calibration method of the display apparatus according to claim 13, wherein the photosensitive detection period includes a voltage reset period and a charge integration period; and
detecting, by the photosensitive element, the luminance of the corresponding sub-pixel, and outputting, by the photosensitive element, the light detection signal to the signal reading element according to the luminance of the corresponding sub-pixel, includes:
in the voltage reset period, a first transistor in the photosensitive element being turned on under control of a first control terminal; and a photosensitive diode in the photosensitive element being reverse biased under actions of voltage signals provided by a first voltage terminal and a second voltage terminal; and
in the charge integration period, the first transistor being turned off under the control of the first control terminal; and the photosensitive diode outputting a voltage signal from a negative electrode to the signal reading element as a light detection signal after receiving an illumination signal from the corresponding sub-pixel.

16. The display apparatus according to claim 12, further comprising a controller coupled to the detection integrated circuit, wherein
the controller is configured to, according to each first detection signal received by the detection integrated circuit, determine an actual luminance of a corresponding sub-pixel, and control a data voltage terminal to provide a compensated data voltage signal to the corresponding sub-pixel according to a difference between the actual luminance and a corresponding target luminance, so as to calibrate a luminance of the corresponding sub-pixel.

17. The array substrate according to claim 1, wherein
the light detection signal includes a light detection voltage signal; and
the signal reading element includes a voltage follower circuit, wherein the voltage follower circuit is configured to read the light detection voltage signal, and output the first detection signal to the first reading signal line according to the light detection voltage signal, and the first detection signal is a voltage following signal in phase with the light detection voltage signal.

18. The array substrate according to claim 17, wherein the voltage follower circuit includes a second transistor, a third transistor and a current source;
- a control electrode of the second transistor is coupled to the photosensitive element, a first electrode of the second transistor is coupled to a third voltage terminal, and a second electrode of the second transistor is coupled to a first electrode of the third transistor and the first reading signal line;
- a control electrode of the third transistor is coupled to a second control terminal, and a second electrode of the third transistor is coupled to the current source; and the current source is further coupled to a fourth voltage terminal, and the current source is configured to maintain a voltage on the second electrode of the second transistor in phase with a voltage on the control electrode of the second transistor when the third transistor is turned on.

19. The array substrate according to claim 1, wherein each sub-pixel of the plurality of sub-pixels corresponds to a photosensitive detection assembly; or
the plurality of sub-pixels include at least one sub-pixel group, and each sub-pixel group corresponds to a photosensitive detection assembly, wherein the sub-pixel group includes at least two sub-pixels disposed adjacent to each other.

20. The array substrate according to claim 19, wherein at least two signal reading elements are coupled to a same first reading signal line.

* * * * *